United States Patent
Yoshida

(10) Patent No.: US 8,970,235 B2
(45) Date of Patent: Mar. 3, 2015

(54) SEMICONDUCTOR TEST DEVICE, SEMICONDUCTOR TEST CIRCUIT CONNECTION DEVICE, AND SEMICONDUCTOR TEST METHOD

(75) Inventor: Atsushi Yoshida, Matsumoto (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 553 days.

(21) Appl. No.: 13/244,548

(22) Filed: Sep. 25, 2011

(65) Prior Publication Data

US 2012/0081139 A1   Apr. 5, 2012

(30) Foreign Application Priority Data

Sep. 30, 2010   (JP) .................................. 2010-222788

(51) Int. Cl.
G01R 31/26 (2014.01)
G01R 31/42 (2006.01)
G01R 31/28 (2006.01)

(52) U.S. Cl.
CPC ............ *G01R 31/2608* (2013.01); *G01R 31/42* (2013.01); *G01R 31/2628* (2013.01); *G01R 31/2841* (2013.01)
USPC ................. 324/750.16; 324/762.01

(58) Field of Classification Search
CPC .... G01R 1/04; G01R 1/06777; G01R 31/129; G01R 31/2608; G01R 31/2628; G01R 31/2841; G01R 31/2879; G01R 31/2886; G01R 31/2887; G01R 31/42; H01L 22/14
See application file for complete search history.

(56) References Cited

U.S. PATENT DOCUMENTS

| | | | |
|---|---|---|---|
| 3,142,382 A | 7/1964 | Knowles et al. | |
| 5,355,082 A | 10/1994 | Schreiber et al. | |
| 6,404,220 B1* | 6/2002 | Hashimoto | ............. 324/750.01 |
| 7,019,547 B2* | 3/2006 | Aghaeepour | ............. 324/750.01 |
| 2004/0113642 A1 | 6/2004 | Sugimoto et al. | |

(Continued)

FOREIGN PATENT DOCUMENTS

| JP | 2009-229259 A | 10/2009 |
|---|---|---|
| JP | 2010-107432 A | 5/2010 |

OTHER PUBLICATIONS

Fuji Electric Systems Co., Ltd., "Fuji IGBT Module Application Manual" (pp. 2-5 to 2-6; 4-2 to 4-7; 5-2; 5-8 to 5-14), [online], Feb. 2010, [searched for on Sep. 17, 2010], internet URL: http://www.fujielectric.co.jp/products/semiconductor/technical/application/index.html.

*Primary Examiner* — Vinh Nguyen
(74) *Attorney, Agent, or Firm* — Rabin & Berdo, P.C.

(57) ABSTRACT

A semiconductor test device and method for sequentially carrying out tests including an AC test, DC test, and thermal resistance test on a power semiconductor device are provided. The semiconductor test device includes a holding unit that positions the power semiconductor device. Test units each generate a test signal for the power semiconductor device and determine a test result generated in response to the test signal. A connection unit switches between the test units and selectively connects the test units electrically to electrodes of the power semiconductor device. The connection unit is controlled such that the test units are sequentially connected to the power semiconductor device to perform a plurality of the tests. The connection unit may include parallel plate electrodes in proximity to each other across an insulating sheet. The parallel plate electrodes may connect the power semiconductor device to positive and negative power sources of the test unit.

8 Claims, 25 Drawing Sheets

(56) References Cited

U.S. PATENT DOCUMENTS

| 2006/0015785 | A1 | 1/2006 | Chun |
| 2006/0132165 | A1* | 6/2006 | Walker et al. ............ 324/765 |
| 2007/0223156 | A1 | 9/2007 | Kumagai et al. |
| 2009/0063085 | A1* | 3/2009 | Conner et al. ............ 702/117 |

* cited by examiner

PARALLEL PLATE CIRCUIT OF FIG. 7

HORIZONTAL AXIS (TIME): 200ns/div

VERTICAL AXIS (VAK): 200V/div

VERTICAL AXIS (IF): 250A/div

PARALLEL PLATE CIRCUIT OF FIG. 7 a US 8,970,235 B2

SEMICONDUCTOR TEST DEVICE, SEMICONDUCTOR TEST CIRCUIT CONNECTION DEVICE, AND SEMICONDUCTOR TEST METHOD

CROSS-REFERENCE TO RELATED APPLICATION

This application claims the benefit of priority of Japanese patent application number 2010-222788, filed on Sep. 30, 2010, the disclosure of which is incorporated herein by reference.

BACKGROUND OF THE INVENTION

1. Technical Field

The present invention relates to a semiconductor test device, semiconductor test circuit connection device, and semiconductor test method that enable various kinds of semiconductor device test to be integrally carried out, and relates in particular to a rationalization of a power semiconductor module test method, an improvement of testing conditions (waveform), and a semiconductor test device improved thereby.

2. Related Art

Final tests and various kinds of test during the manufacturing process on power semiconductor products typified by an insulated gate bipolar transistor (IGBT), a power metal oxide semiconductor field effect transistor (MOSFET), or the like, are broadly divided into a thermal resistance test, a DC parametric test, and an AC parametric test. As test circuits normally used for each of these tests differ, independent semiconductor test devices are used.

A thermal resistance test of a power semiconductor product is a test for measuring the heat release characteristics of a package, and guaranteeing the quality thereof. Also, in a DC parametric test, static characteristics such as a semiconductor element leakage current or on-voltage are measured. Herein, the DC parametric test may also be called a DC parameter characteristic test, a static characteristic test or, using the name of a characteristic configuring a DC characteristic, a breakdown voltage, leak current, forward voltage test, gate threshold voltage value test, or the like. A DC tester with which it is possible to test the DC characteristics collectively, or a DC/thermal resistance tester that also includes a thermal resistance test function, also exist for the purpose of a semiconductor element DC parametric test, and it is customary to carry out the Final tests and in-process tests using one of these testers.

Meanwhile, an AC parametric test of a power semiconductor product is a test for measuring switching characteristics, or the like, typified by the fall time when a semiconductor element carries out a switching action, the reverse recovery time of a high speed diode (FWD: free wheeling diode) incorporated in the semiconductor element, or the like, and guaranteeing the quality thereof. In the case of the AC parametric test too, it may be called a dynamic characteristic test, or by the name of a test for measuring an individual AC characteristic. For example, it may be a switching characteristic test, a load short circuit test, a short circuit safe operation area (SCSOA) test, a reverse bias safe operation area (RBSOA) test, an avalanche test, or a reverse recovery characteristic test. Of the AC parametric tests, the switching test (turn off test and reverse bias safe operation area test) and FWD reverse recovery characteristic test can, in principle, be implemented with a common test circuit, and an integrated test device is generally used for both tests. However, as a circuit different from the switching test circuit is necessary for the load short circuit test and SCSOA test, the tests are carried out using an independent load short circuit tester.

In this way, when shipping a power semiconductor product, it is common to carry out the tests using in the region of four testers, a DC tester, a thermal resistance tester (or a DC/thermal resistance integrated tester), a switching tester, and a load short circuit tester.

Hereafter, a description will be given, based on FIGS. 17 to 22, of an outline of heretofore known testers for a power semiconductor module.

FIG. 17 is a circuit diagram showing a configuration of a heretofore known test circuit for a switching test. Herein, a test circuit used in a switching test for a 6-in-1 module used when driving a three-phase alternating current motor is shown. FIG. 18 is a timing chart showing an example of measurement signals supplied to the test circuit of FIG. 17. A heretofore known testing procedure for a device under test is also shown in JP-A-2009-229259.

With this test circuit, it is possible to test, for example, a 6-in-1 type IGBT module 1 formed of six IGBTs as a device under test (DUT). A DC power source 3 is connected between a P terminal and N terminal of the IGBT module 1 across a protective switch circuit 2. Also, an electrolytic capacitor 4 with a largish capacity is normally connected in parallel with the DC power source 3 in order to supply a charge sufficient to be able to carry a specified current from the DC power source 3, which is a power source unit. Gate drive units 51 are individually connected to the gate and auxiliary emitter terminal (gate drive emitter terminal) of the IGBT of the switch circuit 2 and each of U to Z phase IGBTs. An inductor 6 is connected as a load in a star connection to a U terminal, V terminal, and W terminal for IGBT module 1 output.

In the timing chart shown in FIG. 18, a two-pulse gate signal is continuously applied to each phase. This is in order to carry out a turn off characteristic (switching characteristic) or RBSOA test when the IGBT is turned off, and carry out a reverse recovery characteristic test on the FWD of the opposing arm (for example, the X-phase FWD when switching the U-phase) simultaneously with carrying out an IGBT turn on characteristic test when the IGBT is turned on. When surge voltage occurring due to circuit inductance when turning off exceeds the DUT withstand voltage, suppression of the surge voltage may be achieved by connecting a snubber circuit between the P terminal and N terminal, or between the collector and emitter of the IGBT phase under test, as necessary (refer to Fuji Electric Systems Co., Ltd. "Fuji IGBT Module Application Manual" (pages 5-8 to 5-14), [online], February, 2010, [searched for on Sep. 17, 2010], internet URL:http://www.fujielectric.co.jp/products/semiconductor/technical/application/index.html).

Also, although the inductor 6, which is the load, is connected to the output terminals in a star connection in FIG. 17, it may also be connected in a delta connection. Also, it is also possible to use a chopper circuit for the switching test and reverse recovery characteristic test. In a combination of two IGBTs, one upper and one lower (for example, the combinations of the U and X phases, V and Y phases, and W and Z phases of the DUT of FIG. 17), with the load inductor 6 connected between the collector and emitter of the IGBT on the side of the arm opposing the phase for which the switching test is carried out (for example, when carrying out the switching test on the X phase IGBT, the opposing arm thereof is the U phase), an on-pulse (generally +15V in the case of an N-channel IGBT) is applied to the gate electrode of the IGBT phase (herein, the X phase) for which the switching test is carried out, the gate pulse is reduced to 0V or less when a specified current is reached, and the current is shut off. At this point, an X phase IGBT turn off characteristic or RBSOA test is carried out. Next, when applying an on-pulse to the gate electrode of the X phase IGBT again while the current previously shut off by the X phase IGBT is flowing back through the circuit of the load inductor 6 and opposing arm (U phase) FWD, the IGBT is turned on, but this time the X phase IGBT turn on characteristics and U phase FWD, which is the opposing arm, reverse recovery characteristics are tested (refer to Fuji Electric Systems Co., Ltd. "Fuji IGBT Module Application Manual" (pages 2-5 to 2-6), [online], February, 2010, [searched for on Sep. 17, 2010], internet URL:http://www.fujielectric.co.jp/products/semiconductor/technical/application/index.html).

FIG. 19 is a circuit diagram showing a configuration of a heretofore known test circuit for a load short circuit test. FIG. 20 is a timing chart showing an example of switch signals and phase gate signals in the test circuit of FIG. 19. Herein, a load short circuit test is a test whereby, in a condition in which a DUT such as an IGBT or power MOSFET is connected directly (with no load) to a DC power source, an on-signal is applied for a specified period to the DUT, and the presence or otherwise of DUT damage is confirmed during that period (refer to Fuji Electric Systems Co., Ltd. "Fuji IGBT Module Application Manual" page 5-2, [online], February, 2010, [searched for on Sep. 17, 2010], internet URL:http://www.fujielectric.co.jp/products/semiconductor/technical/application/index.html).

Changeover switches SW1 to SW5 for connecting a power source directly to the IGBT of a phase under test included in an IGBT module 1 are included in the test circuit of FIG. 19. Herein, switching between the switches SW1 to SW5 is carried out according to a specified procedure, and an on-pulse is supplied for a specified period to the gate of the IGBT of the phase under test. By so doing, a large current of 100 A to 10,000 A or more is carried for a time of a few microseconds to a few tens of microseconds between the collector and emitter electrodes of the IGBT module 1.

In the load short circuit test, generally, by causing a large current to flow for a short period through the IGBT module 1, the voltage between the collector and emitter electrodes, or between the gate and emitter electrodes, of the DUT is greatly affected by the test circuit inductance while the current change is occurring. For this reason, it is necessary to configure main circuit wiring, such as wiring connecting the electrolytic capacitor 4, which is the DC power source, and the collector and emitter electrodes of the DUT, and wiring causing the output terminals of FIG. 19 to mutually short circuit, to be extremely short in accordance with the DUT switching speed, energy to be applied, and the like. For example, it is preferable to reduce the length to 50 nH or less in the case of an IGBT module 1 through which a short circuit current of 3,000 A or more flows, to 100 nH or less in the case of 1,000 A or more, and to 200 nH or less in the case of 500 A or more. Also, in the event of a particular request, the test current value or turn off time may be measured, cross-checked with a standard value, and evaluated as good or defective.

However, in the heretofore known test circuit, it is necessary to select switches that can carry a large current as the switches SW1 to SW5, and to connect them with short wiring. For this reason, when a large amount of space in a test device is taken up by the switch mechanism, it is difficult to dispose components, such as the inductor, required in the switching test circuit of FIG. 17. Therefore, it is common that an independent tester is used for each of the load short circuit test and switching test.

Also, here too, in the same way as in the switching test circuit of FIG. 17, the electrolytic capacitor 4 is disposed in parallel with the DC power source 3 or, when it is necessary to suppress surge voltage, a snubber circuit is connected.

FIG. 21 is a circuit diagram showing an example of a heretofore known DC parametric test device test circuit.

A DC power source, a constant current source, a measurement circuit, changeover switches thereof, and the like, are incorporated in a main body of a DC tester 7, and various types of DC characteristic can be measured. For a DC parametric test on a type wherein a plurality of IGBTs and FWDs are incorporated in one DUT package, for example, the IGBT module 1, it is common to insert a switcher 8 (also called a scanner) between the DC tester 7 and IGBT module 1. The switcher 8 is a device incorporating a plurality of switches, and has a function of automatically connecting each terminal of the IGBT and FWD of the phase to be measured to the input terminals of the DC tester 7. When the DUT is a 1-in-1 module with one semiconductor element, each terminal may be directly connected to the corresponding input terminal of the DC tester 7, and the DC characteristics measured.

Herein, the DC tester 7 may have three input terminals—a gate terminal G, collector terminal C, and emitter terminal E corresponding to the names of the DUT terminals—or four input terminals—the gate terminal G, the collector terminal C, a main circuit emitter terminal E1, and a gate drive auxiliary emitter terminal E2. When it is necessary to increase the measurement accuracy, a Kelvin connection is used. In this case, the switcher 8 and each terminal are connected by two lines, a force line F and a sense line S. For a thermal resistance test too, the configurations of the DC tester 7 and switcher 8 are the same as in the case of the DC parametric test device.

Of the heretofore known test circuit configurations, it is necessary to connect an electrolytic capacitor, snubber circuit, test inductor, and the like, to the DUT for the switching test shown in FIG. 17 and the like, meaning that, as they have an effect on the DC characteristic measurement shown in FIG. 21, it is not possible to use the same contact device. Because of this, it is necessary that the switching test, and DC parametric test and thermal resistance test, are carried out with independent testers and contact units.

FIG. 22 is a plan view showing a circuit wiring structure in the test circuits of FIGS. 17 and 19. The load inductor and short circuit test changeover switches SW1 to SW5 connected to the output terminals U, V, and W of the IGBT module are not shown.

A circuit wiring structure configured of a copper pattern corresponding to the circuit wiring portion surrounded by a broken line 10a of FIG. 17 is shown in FIG. 22. A copper plate 11 configures a positive electrode side copper pattern, and is disposed between the DC power source 3 and protective switch circuit 2. One end of a copper wire 3a, of which the other end is connected to the positive side of the DC power source 3, is screwed down by the positive electrode terminal portion of the electrolytic capacitor to a terminal portion 11a of the copper plate 11. The switch circuit 2 is configured of, for example, an IGBT, and includes the gate terminal G, main circuit emitter terminal E1, gate drive auxiliary emitter terminal E2, and collector terminal C. A copper bar 12 connects the copper plate 11 and switch circuit 2, one end being screwed down to a terminal portion 11d, and the other end to the collector terminal C of the switch circuit 2.

A gate drive unit 52 is connected by wire to the gate terminal G and auxiliary emitter terminal E2 of the switch circuit 2, and furthermore, is also connected to a control unit 5. The emitter terminal E1 of the switch circuit 2 is connected via a copper bar 13 to an IGBT module 1P terminal contact portion 1P by the copper bar 13 being screwed down. A copper bar 14 is connected between an IGBT module 1N terminal contact portion 1N and a terminal portion 15d of a copper plate 15 configuring a negative electrode side copper pattern by being screwed down. The copper plate 15 is disposed in a condition in which it is approximately superimposed on the copper plate 11 across an unshown insulating body, and one end of a copper wire 3b, of which the other end is connected to the negative side of the DC power source 3, is screwed down by the negative electrode terminal portion of the electrolytic capacitor to a terminal portion 15c of the copper plate 15. The electrolytic capacitor 4 shown in FIG. 17, and the like, is connected to the two copper plates 11 and 15 by terminal portions 11a and 15a, terminal portions 11b and 15b, and terminal portions 11c and 15c. Although the electrolytic capacitor shown in FIG. 17 has a three capacitor parallel connection specification, there is no particular limitation to three capacitors, and the quantity of capacitors connected in parallel or series is determined in accordance with the charge needed for the test, which is determined by test current, voltage, and circuit inductance.

Also, a snubber circuit 9 and surge voltage protection diode 2d are disposed in positions between the copper bars 13 and 14 connected to the IGBT module 1 contact portions 1P and 1N. The snubber circuit 9 and surge voltage protection diode 2d are connected by screwing down to the copper bars 13 and 14 via copper bars 13a and 13b and copper bars 14a and 14b respectively.

The copper plate 11 and copper bar 12, the copper plate 15 and copper bar 14, and the copper bars 13, 13a, and 13b, may each be configured integrally (as one copper plate), without being connected by screwing down.

The wiring method shown in FIG. 22 is easily changed, and can accommodate a variety of DUTs. That is, there is an advantage in that, simply by preparing wiring members such as the copper plates 11 and 15 and copper bars 12 to 14, which have a plurality of pattern forms, it is possible to configure a test circuit with a comparatively high degree of freedom.

On the other hand, however, as the wiring in the test circuit as a whole is long, surge voltage (overvoltage) caused by wiring inductance when the DUT is turned off is liable to occur. Also, the current when the DUT is turned on rises while being limited by the test voltage and wiring inductance, and the current change rate (di/dt) becomes gentler. For this reason, a problem occurs in that measurement of characteristics such as rise time (tr) becomes difficult, or stress applied in an FWD reverse recovery test is insufficient. Naturally, to counter these problems, a snubber circuit (refer to Fuji Electric Systems Co., Ltd. "Fuji IGBT Module Application Manual" (pages 5-8 to 5-14), [online], February, 2010, [searched for on Sep. 17, 2010], internet URL: http://www.fujielectric.co.jp/products/semiconductor/technical/application/index.html) has been connected heretofore with the object of absorbing a voltage surge when turning off. Also, a method such as connecting a comparatively large capacitor in a close position between the P terminal and N terminal of the DUT has also been employed in order to steepen the di/dt when turning on.

However, even in the same AC parametric test, it is necessary to dispose all of a load inductance, a changeover switch thereof, terminal short circuit changeover switches, an electrolytic capacitor, and a snubber circuit in the immediate vicinity of the DUT in order to reduce the stray inductance of the test circuit. This is because the stray inductance is a cause of surge voltage occurring during the test, and of the current change rate (di/dt), which is one test condition, becoming gentler, and causes a problem such as the voltage and current oscillating, damaging the DUT.

However, with this method of dealing with the matter, there are problems in that the quantity of each part increases, current measurement becomes complicated because it is necessary to cancel the current flowing through the snubber circuit in order to measure only the current flowing through the DUT, and the like. Moreover, when the DUT is damaged, the whole of the charge stored in the capacitor connected to the P and N contact portions of the DUT flows from the capacitor into the DUT. Because of this, when the capacity of the capacitor disposed in the immediate vicinity is large, the sound of explosion when the DUT is damaged is large, and there is a problem in that the state of damage to not only the DUT but also the peripheral circuit portion is noticeable. Therefore, with the exception of limited semiconductor test devices that have a low capacity range IGBT as a DUT, the switching test of FIG. 17, and the like, and the load short circuit test of FIG. 19, and the like, have heretofore each been implemented with an independent tester.

In this way, when implementing an AC parametric test (switching test), AC parametric test (load short circuit test), thermal resistance test, and DC parametric test sequentially, heretofore, an independent tester and test contact device have been necessary for each test, and it has not been possible to use the same components or measurement circuits in each tester. Because of this, the initial investment when introducing a semiconductor test device, that is, the equipment cost, increases. Also, as the DUT needs to be loaded into and unloaded from a plurality of test contact devices, and moreover, time is needed to switch a mechanical switch, testing efficiency decreases, and personnel costs for implementing the tests also increase. Furthermore, there is a problem such as that a conveying unit when conveying the DUT to the semiconductor test device is also complicated and expensive.

SUMMARY OF THE INVENTION

The invention, having been contrived bearing in mind these kinds of problem, has an object of providing a semiconductor test device, a semiconductor test circuit connection device, and a semiconductor test method that enable a reduction in the quantity of test contact devices, and enable a reduction in equipment costs by enabling a sharing of tester components and measurement circuits.

In some embodiments, a semiconductor test device for sequentially carrying out tests including an AC test, DC test, and thermal resistance test on a power semiconductor device is provided. The semiconductor test device includes a holding unit that positions the power semiconductor device in a predetermined position. A plurality of test units each generate a test signal for the power semiconductor device and determine a test result from a signal generated in response to the test signal. A connection unit switches between the test units and selectively connects the test units electrically to predetermined electrodes of the power semiconductor device. The connection unit is controlled such that the test units are sequentially connected to the power semiconductor device to perform a plurality of the tests.

In some embodiments of the invention, semiconductor test device is provided. The semiconductor test device includes a semiconductor test circuit that generates a test signal to perform an AC test on a power semiconductor device. The semiconductor test circuit has positive and negative power sources. The semiconductor test device includes a connection device having parallel plate electrodes disposed in parallel, and proximate to each other with an insulating sheet disposed therebetween. The parallel plate electrodes are movable between a first position to electrically connect the power semiconductor device to the positive and negative power sources and transmit the test signal to the power semiconductor device, and a second position to electrically disconnect the power semiconductor device from the positive and negative power sources and prevent transmission of the test signal to the power semiconductor device.

In some embodiments of the invention, a semiconductor test method for sequentially carrying out an AC test, DC test, and thermal resistance test on a power semiconductor device is provided. The method includes holding the power semiconductor device in a predetermined position with a holding unit. The method further includes electrically connecting a first test unit that performs one of the AC test, DC test, and thermal resistance test to predetermined electrodes of the held power semiconductor device. A generated predetermined test signal from the first test unit is supplied to the power semiconductor device. A test result is determined from a signal from the power semiconductor device generated in response to the predetermined test signal. The method further includes switching to a second test unit that performs another one of the AC test, DC test, and thermal resistance test on the power semiconductor device so that a plurality of tests are performed on the power semiconductor device.

According to the semiconductor test device, semiconductor test circuit connection device, and semiconductor test method of the invention, it is possible to reduce the quantity of test contact devices by test functions being integrated. Also, it is possible to reduce initial investment, such as investment costs, and personnel costs. Furthermore, a sharing of tester components and measurement circuits is possible, and it is possible to reduce equipment costs.

DETAILED DESCRIPTION OF THE EMBODIMENTS

Figure 1:
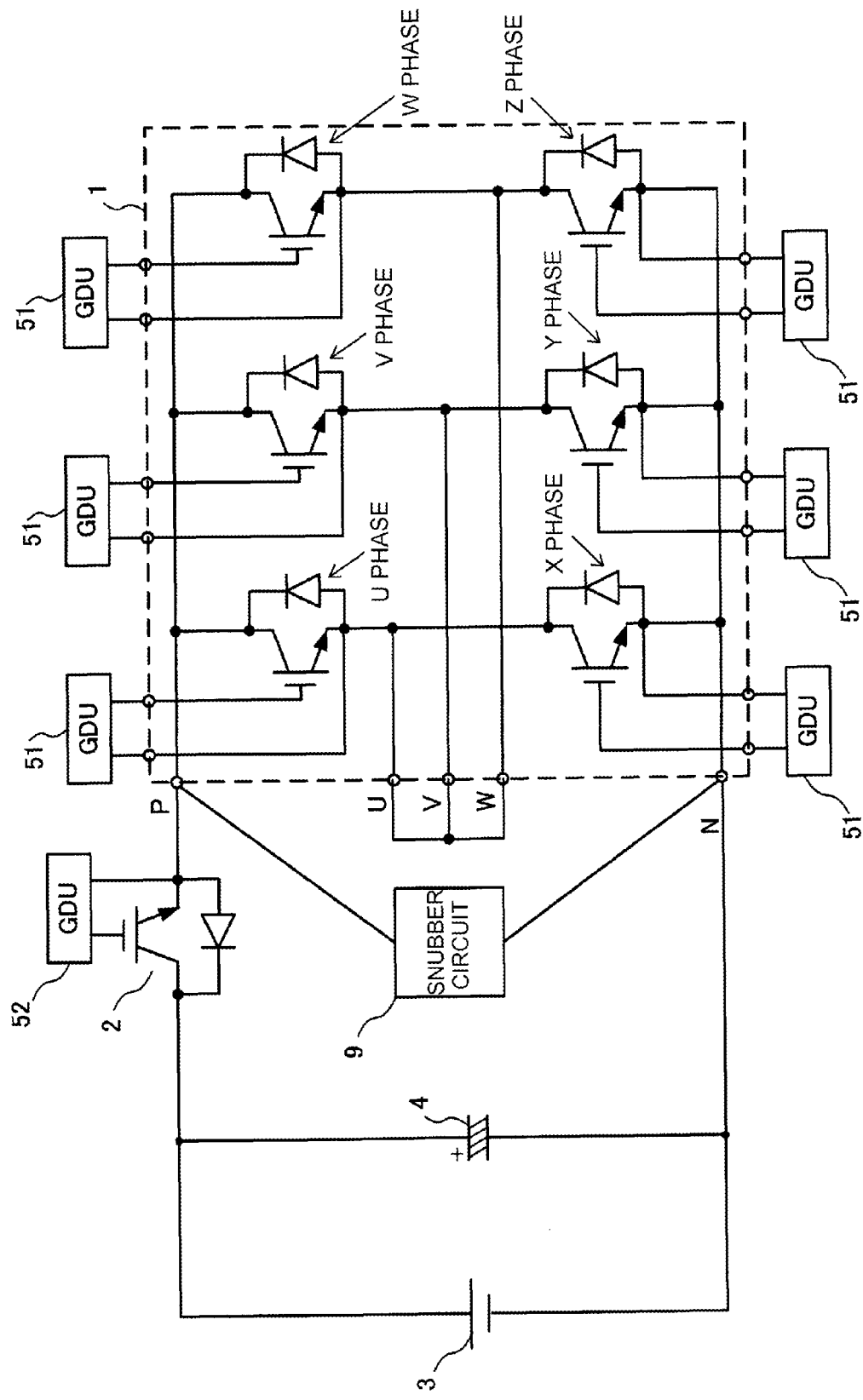
FIG. 1 is a circuit diagram showing a configuration of a test circuit for carrying out a load short circuit test at high speed.

Hereafter, a description will be given, referring to the drawings, of embodiments of the invention.

First Embodiment

Firstly, a description will be given of an acceleration of a load short circuit test, which is one IGBT module AC parametric test. FIG. 1 is a circuit diagram showing a configuration of a test circuit for carrying out a load short circuit test at high speed.

A 6-in-1 type IGBT module 1 used when driving a three-phase alternating current motor is connected as a DUT in the test circuit. That is, a P terminal of the IGBT module 1 is connected to the positive side, and an N terminal to the negative side, of a DC power source, and output terminals (U, V, and W) are mutually short circuited in the immediate vicinity of the IGBT module 1. A DC power source 3 is connected between the P terminal and N terminal of the IGBT module 1 across a protective switch circuit 2. Also, an electrolytic capacitor 4 with a largish capacity is normally connected in parallel with the DC power source 3 in order to supply a charge sufficient to be able to carry a specified current from a power source unit.

Also, the IGBTs of the IGBT module 1 are such that an individual gate drive unit 51 is connected to the gate terminal and auxiliary emitter terminal (gate drive emitter terminal) of each of an X, Y, and Z phase and U, V, and W phase. Furthermore, a separate gate drive unit 52 is connected to the gate terminal and auxiliary emitter terminal of the switch circuit 2.

A snubber circuit 9 is connected between the P terminal and N terminal of the IGBT module 1, with a main object of suppressing surge voltage. The snubber circuit 9 may also be connected between the collector and emitter electrodes of the phase (IGBT) under test (refer to Fuji Electric Systems Co., Ltd. "Fuji IGBT Module Application Manual" (pages 5-8 to 5-14), [online], February, 2010, [searched for on Sep. 17, 2010], internet URL:http://www.fujielectric.co.jp/products/semiconductor/technical/application/index.html).

In this condition, a load short circuit test is carried out for each phase sequentially, simply by controlling with a gate drive signal. Because of this, there is no need for a switching with a mechanical switch, and load short circuit testing is possible at a high speed (in a short time).

Figure 2A:
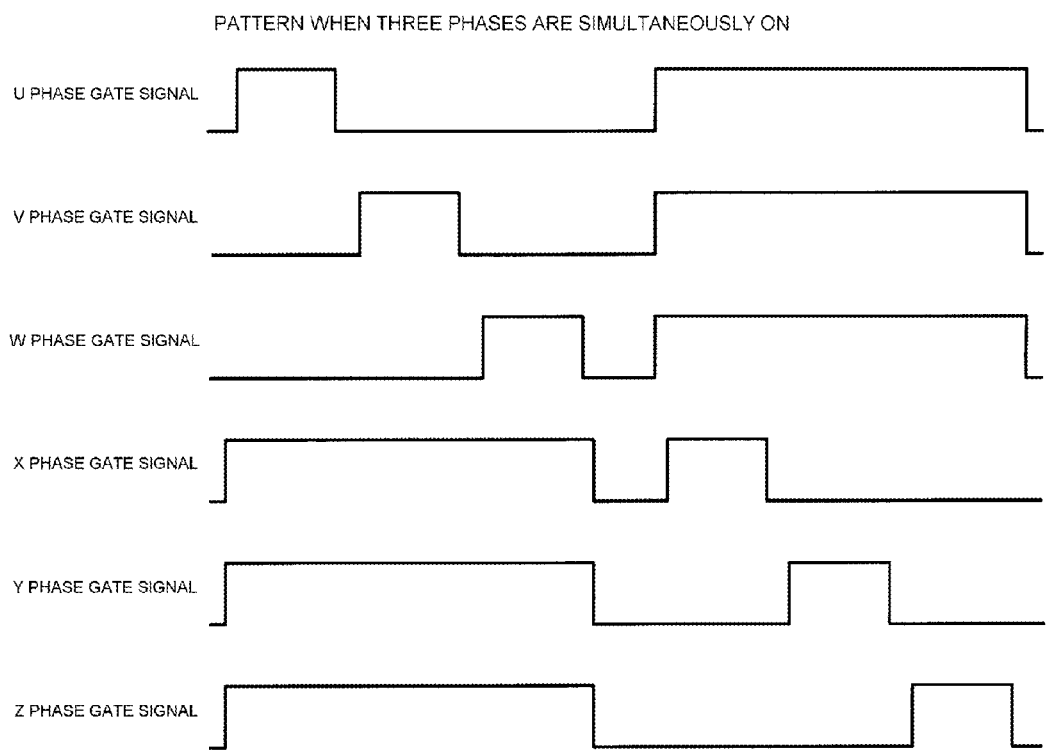
FIGS. 2A and 2B are timing charts showing examples of measurement signals supplied to the test circuit of FIG. 1.
Figure 2B:
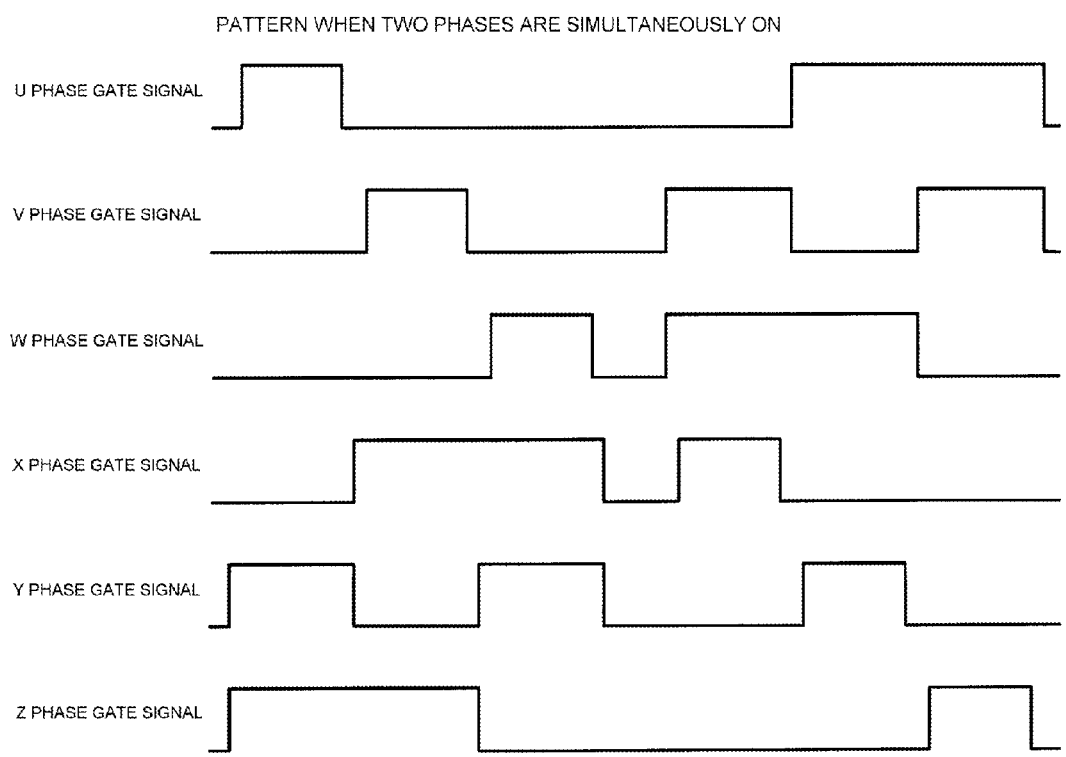

Next, a description will be given, using the timing charts of FIGS. 2A and 2B, of a specific load short circuit test procedure. FIGS. 2A and 2B are timing charts showing examples of measurement signals supplied to the test circuit of FIG. 1.

When testing the U phase IGBT of the IGBT module 1, a plurality (two or three) of IGBTs of the X, Y, and Z phase IGBTs, which are the opposing arm, are put into a turned on condition in advance, and in this condition, an on signal is applied to the gate terminal of the U phase IGBT for a specified time. Continuing, testing is also carried out for the V phase and W phase in the same way as for the U phase.

Next, when testing the X phase, a plurality (two or three) of IGBTs of the U, V, and W phase IGBTs, which are the opposing arm, are put into a turned on condition in advance, and in this condition, an on signal is applied to the gate terminal of the X phase IGBT for a specified time. Load short circuit testing can also be implemented for the Y phase and Z phase of the IGBT module 1, in the same way as for the X phase.

With the test circuit shown in FIG. 1, it is possible to carry out load short circuit testing for all the six phases of IGBT, without carrying out any switching with a mechanical switch. Consequently, when comparing with the heretofore known method whereby testing is carried out after establishing the phase under test by a turning on and off with a mechanical switch, there is an advantage with this kind of load short circuit testing method in that no switching time is needed, even when there is a large number of transistors incorporated in one IGBT module 1.

It is necessary that a short circuit current selected for the protective switch has a rating sufficiently larger than that of a short circuit current of the DUT being measured.

Second Embodiment

Next, a description will be given of a test circuit that implements a switching test, which is another AC parametric test, integrally with a load short circuit test.

Figure 3:
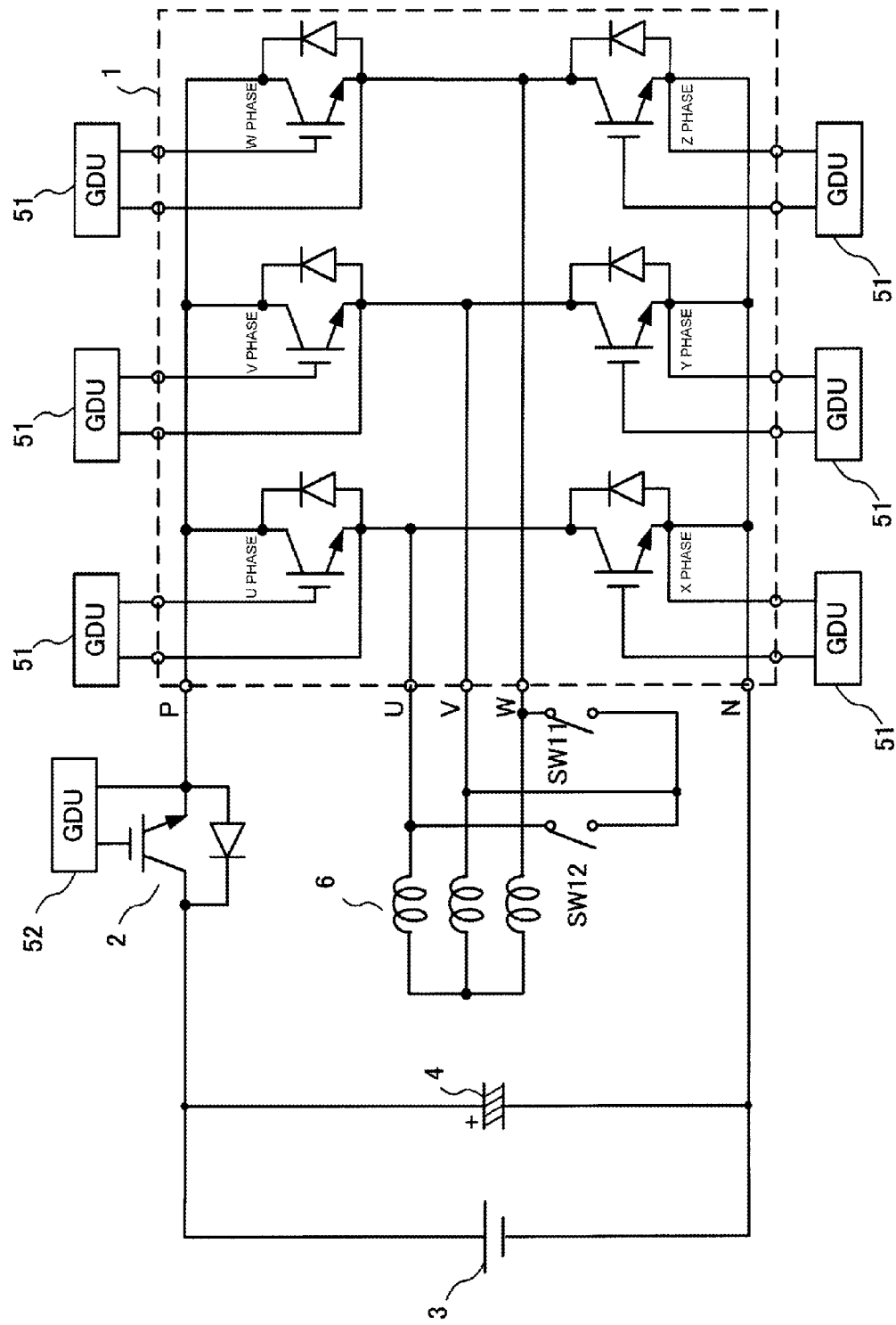
FIG. 3 is a circuit diagram showing a configuration of an integrated test circuit for integrally implementing a switching test and load short circuit test.

FIG. 3 is a circuit diagram showing a configuration of an integrated test circuit for integrally implementing a switching test and load short circuit test.

In the integrated test circuit too, with the 6-in-1 type IGBT module 1 as the DUT, the P terminal of the DUT is connected to the positive side, and the N terminal to the negative side, of the DC power source 3. Also, a load inductor 6 is connected to each of the output terminals (U, V, and W) in a star connection, and switches SW11 and SW12, which cause a short circuit between the output terminals, are connected in parallel with the load inductor 6. Although there is no switch in the wire from the V terminal in FIG. 3, a switch may be inserted. Furthermore, the gate drive units 51 are connected individually to the gate terminal and auxiliary emitter terminal (gate drive emitter terminal) of each phase of IGBT.

Figure 4:
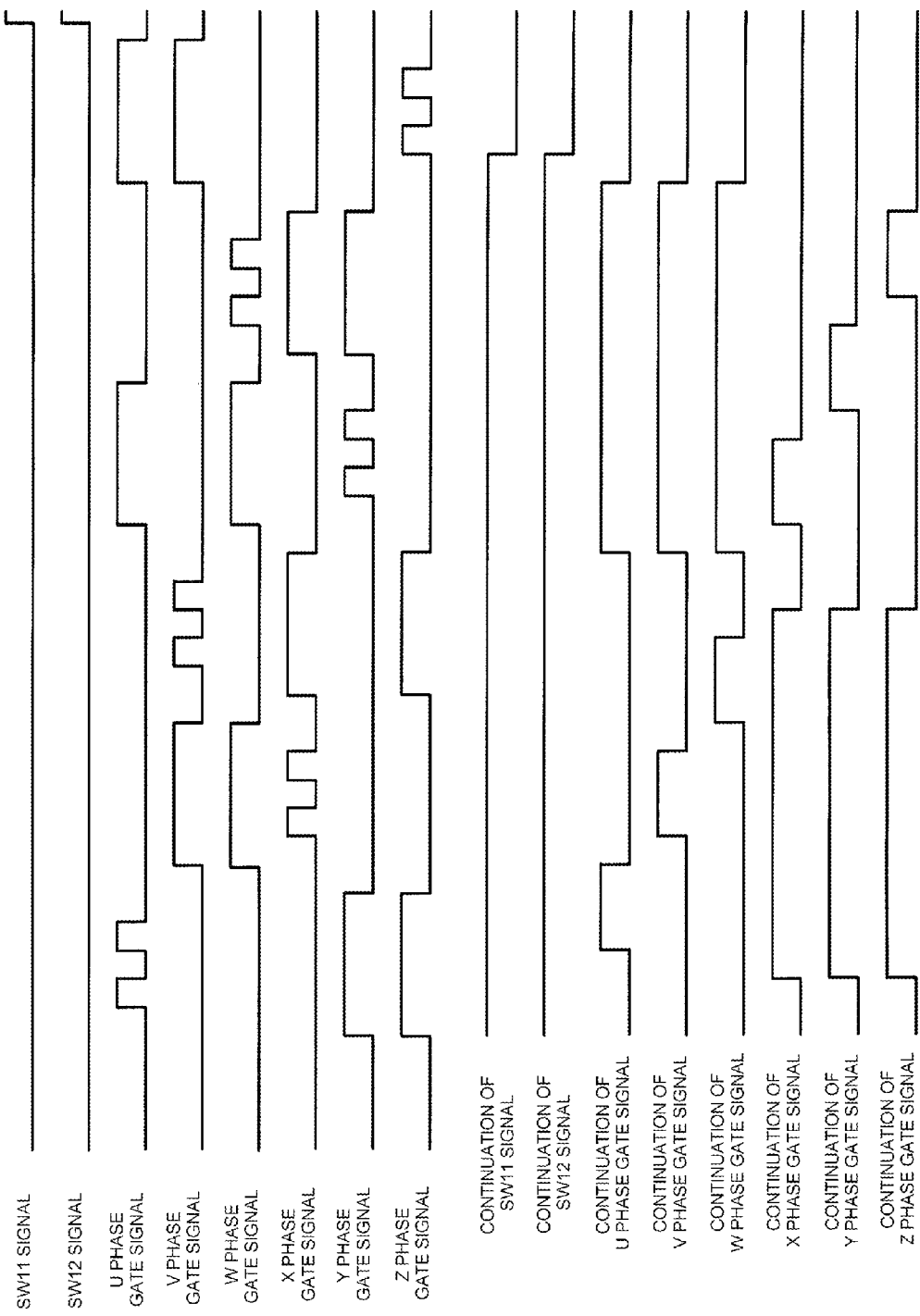
FIG. 4 is a timing chart showing an example of switch signals and phase gate signals in the integrated test circuit of FIG. 3.

FIG. 4 is a timing chart showing an example of switch signals and phase gate signals in the integrated test circuit of FIG. 3.

Firstly, power source voltage is set to a specified value, the switch SW11 and switch SW12 are put into an opened condition, and a switching test is carried out. When carrying out a switching test for the U phase IGBT, the Y phase and Z phase IGBTs are put into a turned on condition in advance, and in this condition, an on pulse is applied to the gate electrode of the U phase IGBT until a specified current is reached. By applying a plurality of pulses, it is also possible to implement an FWD reverse recovery characteristic test for the X phase, which is the opposing arm, simultaneously with the turning on of the U phase IGBT from the second gate signal onward.

In the same way, a switching test is carried out for the V phase IGBT and W phase IGBT. At this time, the testing is carried out sequentially after putting the X phase and Z phase IGBTs when testing the V phase, and X phase and Y phase IGBTs when testing the W phase, into a turned on condition in advance. Next, a switching test is carried out for the X phase, Y phase, and Z phase IGBTs, but at this time, the testing is carried out sequentially after putting the V phase and W phase IGBTs when testing the X phase, U phase and W phase IGBTs when testing the Y phase, and U phase and V phase IGBTs when testing the Z phase, into a turned on condition in advance.

The switching test is thereby completed, and next, the switch SW1 and switch SW2 are closed in order to carry out a load short circuit test. By so doing, it is possible to carry out a load short circuit test in the same way as that described with the measurement circuit of FIG. 1. At this time, there is also a case wherein the short circuit test is carried out by shutting off each output terminal U, V, and W, and the load inductor 6, using an unshown switch, or the like.

Next, a description will be given of an integration of an AC parametric test and DC parametric test.

Third Embodiment

Figure 5:
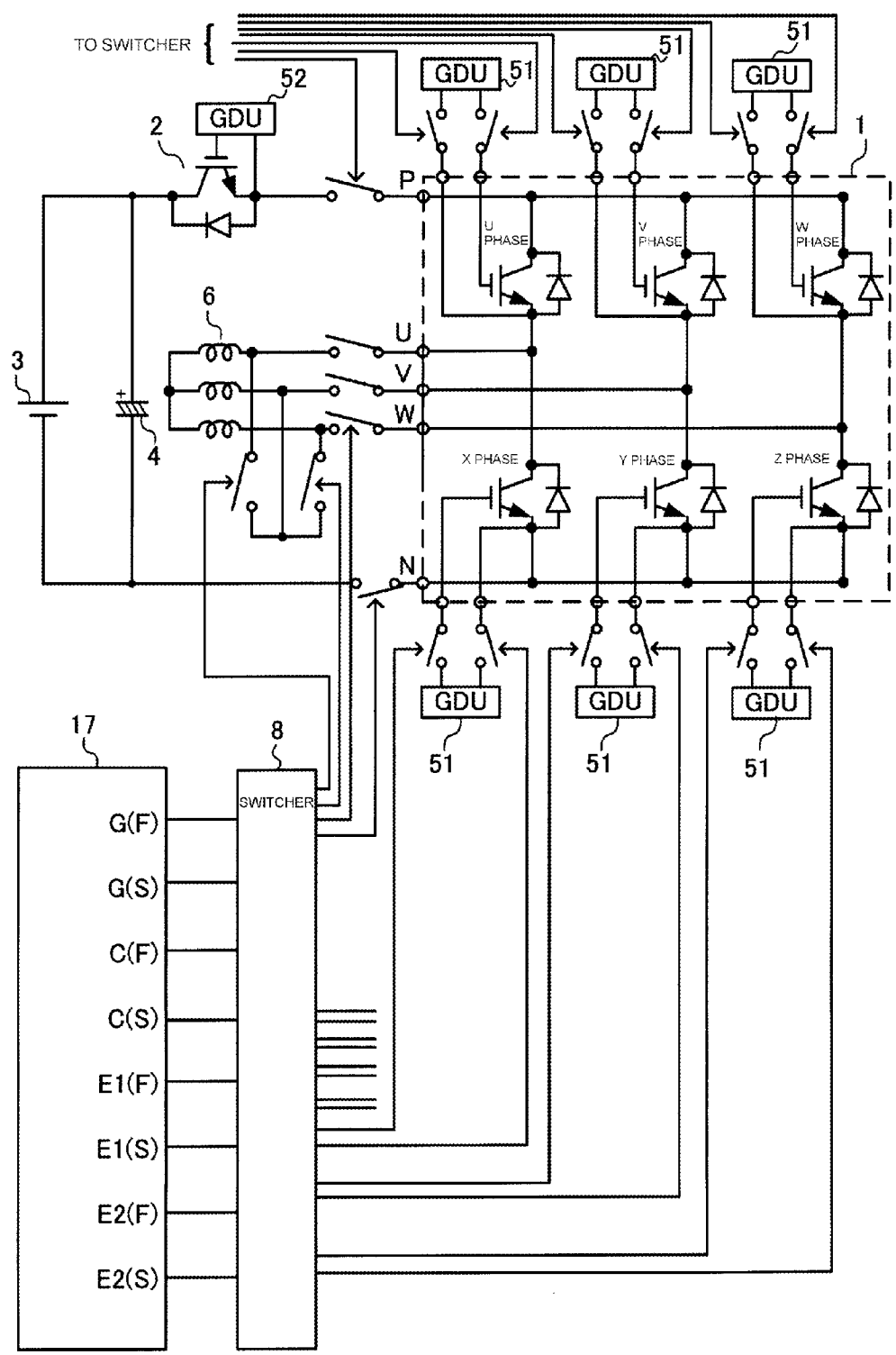
FIG. 5 is a circuit diagram showing a configuration of a test circuit for integrally implementing a DC parametric test and AC parametric test.
Figure 6:
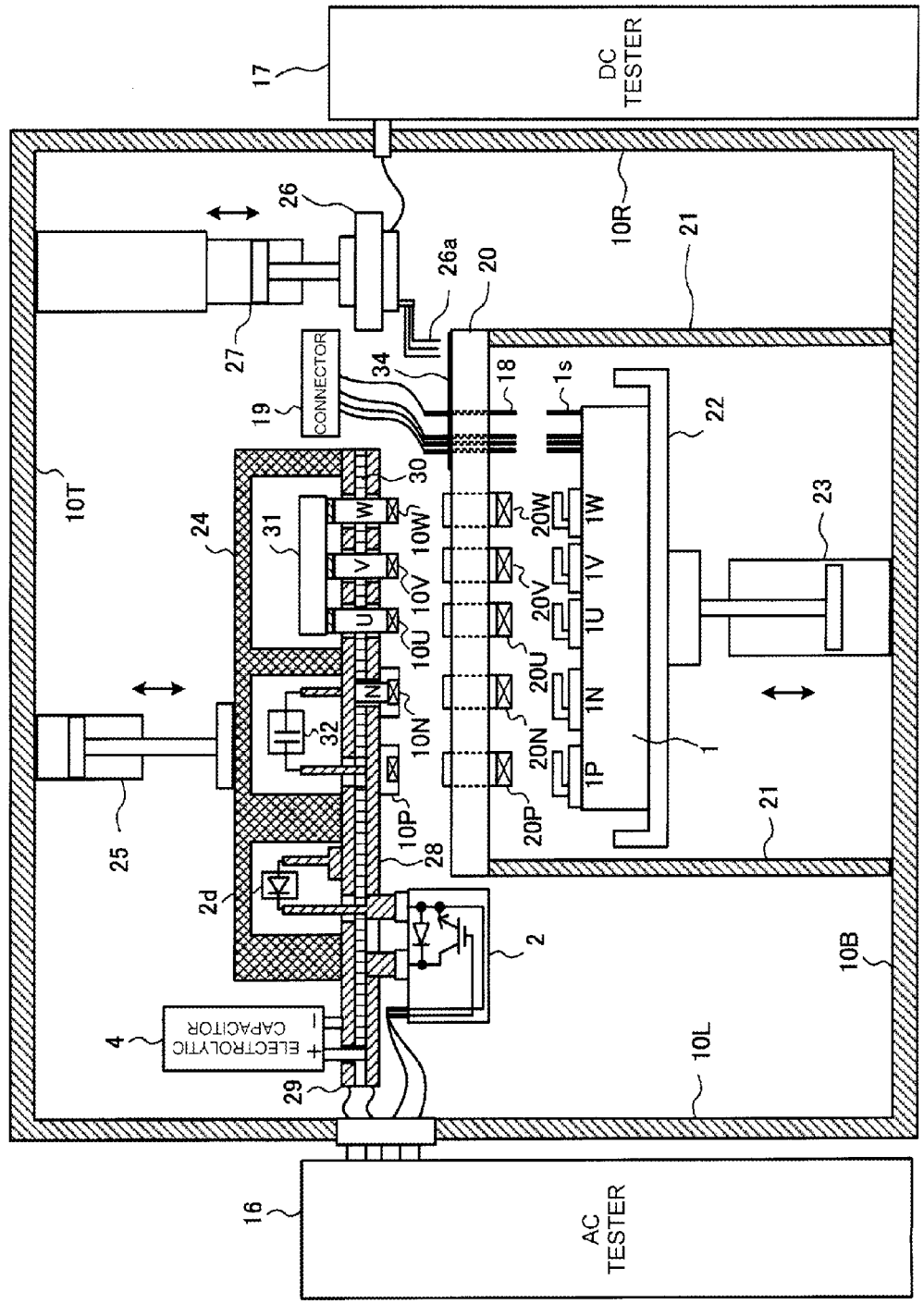
FIG. 6 is a side view showing the structure of a DC/AC integrated tester for realizing the test circuit of FIG. 5.

FIG. 5 is a circuit diagram showing a configuration of a test circuit for integrally implementing a DC parametric test and AC parametric test, and FIG. 6 is a side view showing the structure of a DC/AC integrated tester for realizing the test circuit of FIG. 5.

Figure 21:
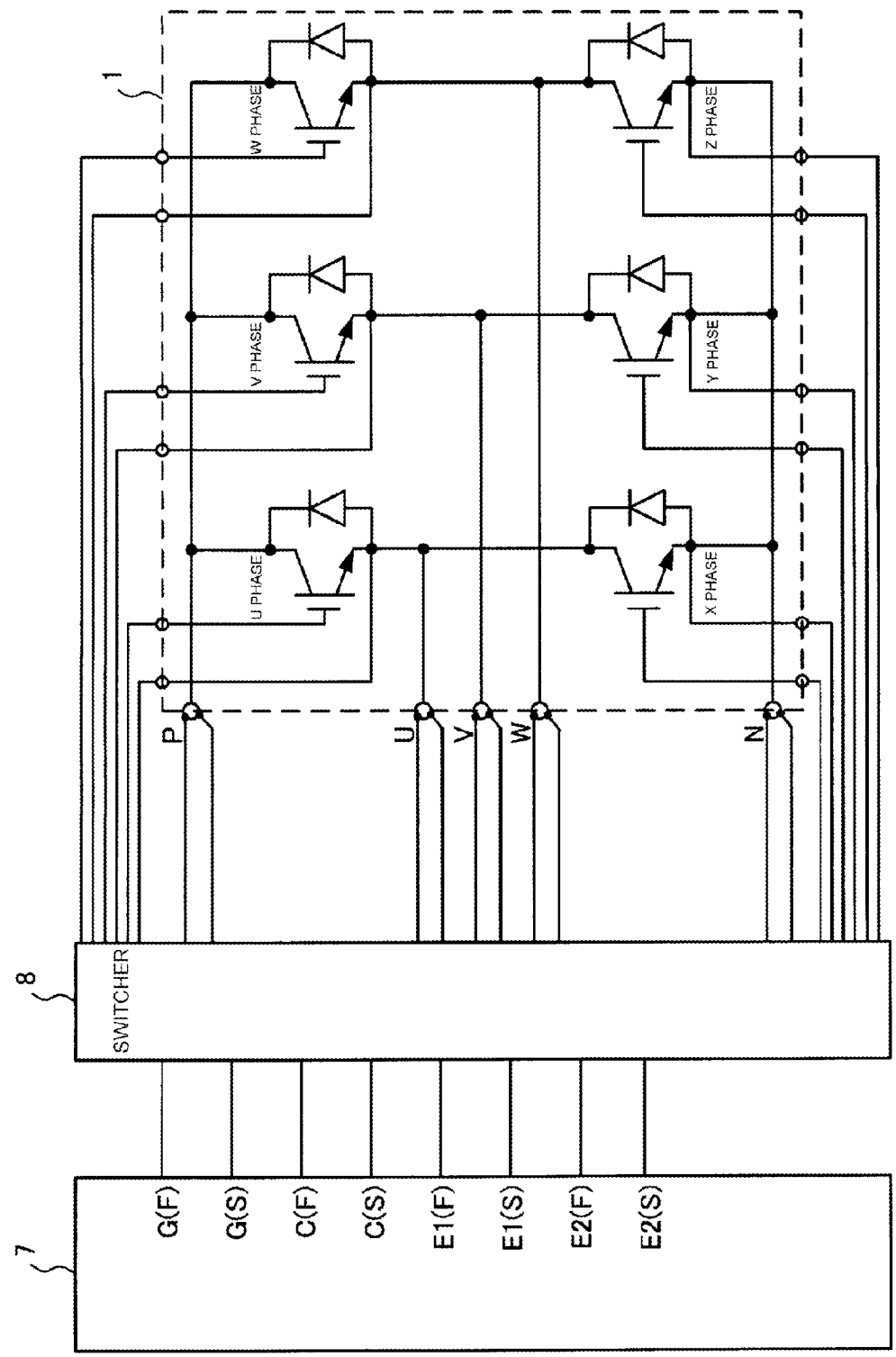
FIG. 21 is a circuit diagram showing an example of a heretofore known DC parametric test device test circuit.

With this test circuit, it is possible to sequentially implement a DC parametric test, including also a thermal resistance test, and AC parametric tests (switching test and load short circuit test) using the same contact device, with the 6-in-1 type IGBT module 1 as the DUT, by setting a change between a heretofore known DC test circuit shown in FIG. 21 and the AC test circuit shown in FIG. 3 by switching with a switch.

A plurality of switches that can be turned on and off are shown in FIG. 5. Also, only a force line is shown as a connecting line from each terminal (positioned at the intersections of the broken line and circle symbols) of the IGBT module 1 to a DC tester 17. Actually, however, a sense line from each terminal is also connected to the DC tester 17.

The IGBT module 1 is connected by the sense lines to a measurement unit of each of the DC tester 17 and an unshown AC tester, or to a measurement unit common to the DC and AC testers, where it is possible to measure each characteristic of a specified IGBT. For example, all of the switches shown in FIG. 5 are set to the DC tester 17 side, and a DC parametric test and thermal resistance test are carried out. Subsequently, the switches are switched to the AC tester side, and an AC parametric test is carried out.

The gate drive units 51 are connected individually to the gate terminal and auxiliary emitter terminal (gate drive emitter terminal) of each phase of IGBT.

Although there are actually a large number of changeover switches disposed in the DC/AC integrated test circuit shown in FIG. 5, for the AC parametric tests (switching test and load short circuit test) in particular, it is necessary to dispose the region between the P terminal and N terminal and the DC power source 3 and electrolytic capacitor 4 in the immediate vicinity, as heretofore described. Also, for the AC parametric test (load short circuit test), it is also necessary to further dispose switches that cause the terminals of the U, V, and W phase IGBTs to be mutually short circuited in the immediate vicinity of the terminals of the U, V, and W phase IGBTs.

This is because the inductance of the test circuit increases in accordance with the switch structure and disposition method. That is, it is because problems arise such that, when a current rise time (a rise time tr and di/dt) when turning on for the AC parametric test (switching test) is limited by the circuit inductance, "the rise time tr of the DUT cannot be measured accurately", or for the FWD reverse recovery characteristic test too, "measurement is not possible under the specified conditions", or "it is not possible to apply the specified electrical stress to the FWD".

For example, when a DUT with a VCES (blocking voltage) rating of 1,200V, a rise time tr of 0.18 μs, and a current rating (=test current) of 600 A is turned on with a Vcc of 600V, it is necessary that a circuit inductance Ls is $$Ls = (Vcc/\Delta IC) * tr$$
$$= (600/600) * 0.18$$
$$= 0.18 \ \mu H$$

or less.

When the circuit inductance is of a size larger than this, the current rise time limited by the test circuit inductance Ls is observed, rather than the time for which the DUT is turned on.

Also, with the test circuit inductance as Ls and the test power source voltage as Vcc, a voltage VCE between the collector and emitter of the IGBT when turning off is fixed at $$VCE = -Ls*(di/dt) + Vcc,$$

and a surge voltage is applied between the collector and emitter of the DUT. Because of this, when the value of the inductance Ls is large, the VCE value also increases, and it may happen that the IGBT module breaks during testing.

However, when configuring the kind of integrated test circuit shown in FIG. 3 using switches formed of a large current relay or a contactor, and wiring formed from a copper bar or the like, as heretofore done, there is a problem in that the circuit inductance is in the region of roughly 0.15 to 0.4 μH.

Therefore, a description will be given of an example of a specific configuration of an integrated test device according to the invention shown in FIG. 6.

In an integrated test device 10, an AC tester 16 and the DC tester 17 are provided separately from a main body of the test device, fixed to the outer side of left and right wall surfaces 10L and 10R respectively, and the main body is connected to the externally installed AC tester 16 and DC tester 17 main bodies by providing connectors or through holes in the wall surfaces 10L and 10R, and passing wiring connecting to the interior through the connectors or through holes. The main body of the device may also be housed in a single rack together with a substrate including both the AC tester and DC tester functions.

Furthermore, in the integrated test device 10, a DUT mounting base 22 and AC test circuit unit 24 are disposed sandwiching a centrally-positioned intermediate electrode plate 20 so as to be able to rise and descend in a vertical direction. The intermediate electrode plate 20 is fixed to a bottom surface 10B of the integrated test device 10 with support plates 21. The DUT mounting base 22 is below the intermediate electrode plate 20, and is raised and lowered vertically by a cylinder 23 in a condition in which the IGBT module 1 is mounted. The IGBT module 1 is held in a predetermined position on the DUT mounting base 22 with each of the external terminals 1N, 1P, 1U, 1V, and 1W of the IGBT module 1 in an upward facing condition, and by raising or lowering with the cylinder 23, each of the external terminals takes on a condition wherein it is connected or not connected to the intermediate electrode plate 20.

Herein, the IGBT module 1 used is an intelligent power module (hereafter called an IPM) including control terminals 1s such as a Vcc, GND, Alarm, and IN of a drive IC, and each of the control terminals 1s disposed in such a way that it can be connected to a vertical probe (a so-called pogo pin) 18 incorporating a spring that penetrates the intermediate electrode plate 20. The probes 18 configure the kinds of contact that connect with predetermined control elements is of the IGBT module 1 when the DUT mounting base 22 is raised by the cylinder 23. Furthermore, the probes 18 are connected to the AC tester 16 and DC tester 17 via a connector 19. Although not shown in the drawing, a gate drive circuit board (equivalent to the GDUs of FIG. 5) and a changeover switch thereof (equivalent to the changeover switches SW of the GDUs and DC test wiring of FIG. 5) may be disposed on, or in the periphery of, the intermediate electrode plate 20, between the probes 18 and connector 19. This is because, when the GDUs 51 and 52 are positioned far from the IGBT module 1, the gate signal oscillates or jumps, the rise and decay are delayed, or the like, resulting in an unstable waveform.

The AC test circuit unit 24 is electrically connected at one end portion to the AC tester 16, and at the other end portion has contact portions 10P, 10N, 10U, 10V, and 10W that project in such a way as to oppose the upper surface of the intermediate electrode plate 20. Also, together with the protective switch circuit 2 and electrolytic capacitor 4, the whole of the AC test circuit unit 24 is held in such a way that it can rise and descend by a cylinder 25 fixed to a top plate 10T of the integrated test device 10.

Herein, the protective switch circuit 2 is of a structure such that it turns off the device on detecting an overcurrent after DUT damage, or a drop in DUT impedance. As heretofore known, by disposing the protective switch circuit 2 from the positive side (P electrode side) of the electrolytic capacitor 4 to the P terminal, it is possible to prevent secondary damage, such as tester failure, contact portion sparking, or DUT explosion, when the DUT is damaged.

A plurality of metal blocks 20P, 20N, 20U, 20V, and 20W are provided in the intermediate electrode plate 20, penetrating from the upper surface to the lower surface thereof, and they are electrodes that carry out the role of connecting the AC test circuit unit 24 and IGBT module 1. For this reason, the metal blocks 20P, 20N, 20U, 20V, and 20W project from the lower surface side of the intermediate electrode plate 20 in positions corresponding to the disposition of the external terminals 1N, 1P, and the like, of the IGBT module 1, and a contact member is disposed on the lower surface of each projecting portion. Then, on the upper surface of the intermediate electrode plate 20, wires are extended in a copper pattern from the metal blocks 20P, 20N, 20U, 20V, and 20W to the positions of the contact portions 10P, 10N, 10U, 10V, and 10W of the AC test circuit unit 24.

Also, a DC contact portion 26 has probes 26a at a leading end for making contact with the intermediate electrode plate 20, selects a condition in which the DC tester 17 and intermediate electrode plate 20 are connected or not connected and, in the same way as the AC test circuit unit 24, is held in such a way that it can rise and descend by a cylinder 27 fixed to the top plate 10T of the integrated test device 10. Although only one contact 26 in contact with the DC tester is shown in FIG. 6, in the case of the 6-in-1 IGBT module 1 (IPM), there actually exist five contacts corresponding one to each of the terminals P, N, U, V, and W of the DUT.

In this way, the metal blocks and copper pattern wiring are used in making contact with the force lines of the external terminals 1P, 1N, 1U, 1V, and 1W, through which a large current flows in the IGBT module 1. Also, contacts formed of the vertical probes 18 incorporating springs are configured for the control terminals, such as the Vcc, GND, Alarm, and IN, of the drive IC incorporated in the IPM, and the sense line of each terminal.

Figure 22:
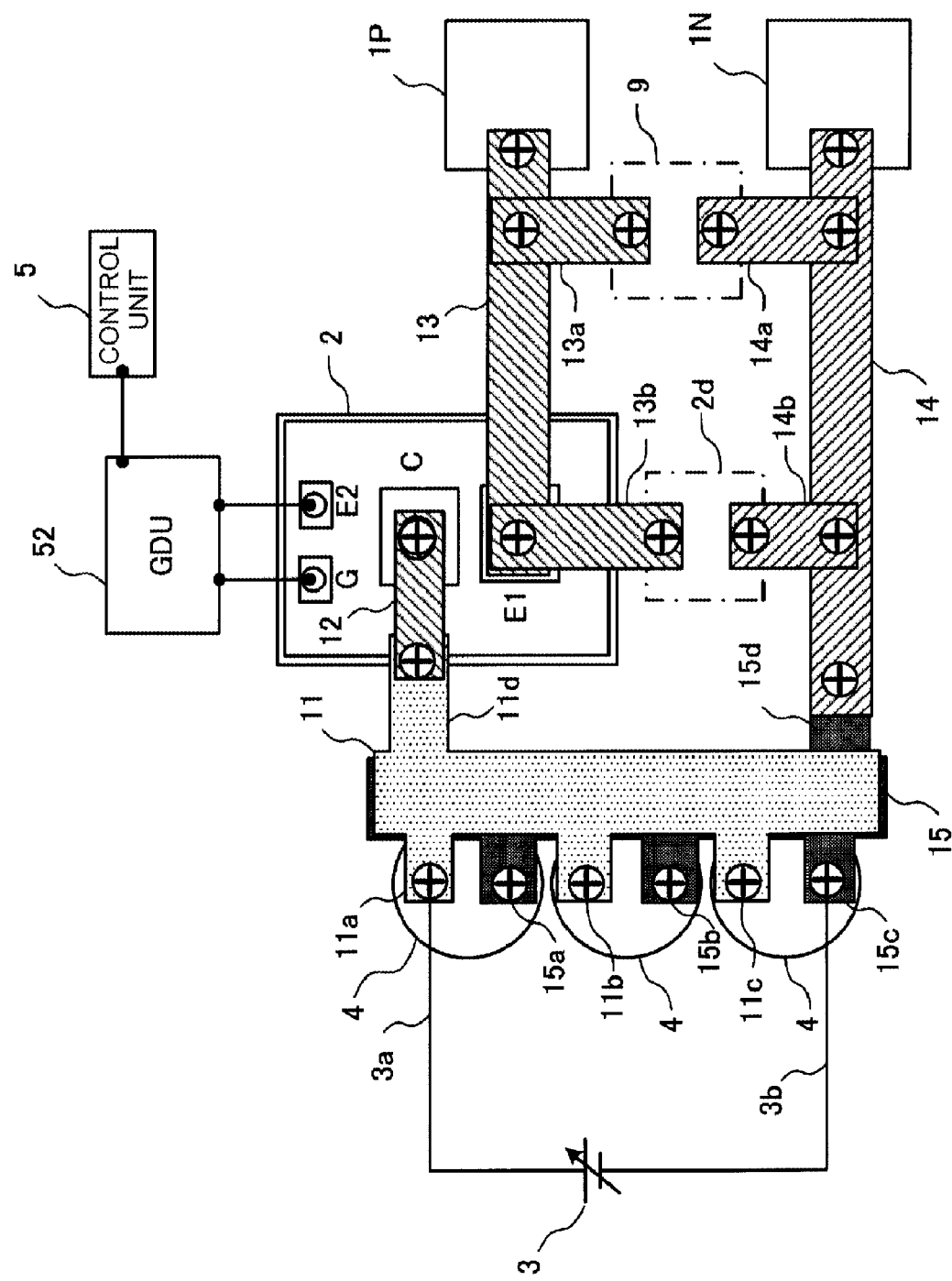
FIG. 22 is a plan view showing a circuit wiring structure in the test circuits of FIGS. 17 and 19.

To date, when a power semiconductor device, or the like, is included in a DUT, there are cases in which a test current of 10,000 A or more is required. Therefore, with a device in which an AC parametric test (dynamic parametric test) is carried out in the test circuit shown in FIG. 1, copper plates 11 and 15, copper bars 12 to 14, or copper wires 3a and 3b, which can tolerate the test current, are used as test circuit wiring members in the connections with each part, such as the protective circuit 2, electrolytic capacitor 4, and test load, and the IGBT module 1, as shown in FIG. 22.

With the integrated test device shown in FIG. 6 too, it is necessary to reduce the circuit inductance of the test circuit in order to satisfy the requirements described for the test circuit of FIG. 5. Herein, the circuit inductance that needs to be reduced is the inductance of the circuit from the positive electrode + of the electrolytic capacitor 4 to the P terminal of the IGBT module 1 via the protective switch circuit, and of the circuit from the N terminal of the IGBT module 1 to the negative electrode − of the electrolytic capacitor 4, which are circuits on the intermediate electrode plate 20 shown in FIG. 6.

Therefore, the AC test circuit unit 24 of FIG. 6 configures an AC contact device with the connection contact portions 10P, 10N, 10U, 10V, and 10W, and parallel plates 28 and 29. That is, the parallel plates 28 and 29 are mounted on the lower surface of the AC test circuit unit 24 as positive and negative wiring for connecting the contact portions 10P, 10N, 10U, 10V, and 10W to the AC tester 16.

Herein, the positive side electrode plate corresponding to the P terminal of the IGBT module 1 is configured of the parallel plate 28 disposed on the side opposing the intermediate electrode plate 20. Also, the parallel plate 29 disposed on the parallel plate 28 across an insulating sheet 30 configures the negative side electrode plate corresponding to the N terminal of the IGBT module 1. A load inductor is connected to the contact portions 10U, 10V, and 10W of the AC test circuit unit 24, or a switch mechanism 31 including a shorting bar, to be described hereafter, is provided.

Also, a capacitor 32 corresponding to the snubber circuit 9 is connected to the contact portions 10P and 10N of the AC test circuit unit 24. A high speed type such as a film capacitor is used as the capacitor 32, and a discharge circuit is connected to either end of the capacitor 32. Furthermore, a diode 2d for surge voltage protection is provided in such a way as to connect the parallel plates 28 and 29 in the vicinity of the protective switch circuit 2.

In this way, the contact external terminals 1N, 1P, 1U, 1V, and 1W of the IGBT module 1 are electrically connected to, respectively, the contact portions 10P, 10N, 10U, 10V, and 10W of the AC test circuit unit 24 across the intermediate electrode plate 20, an application of an electric signal, voltage, or current of the AC tester 16 is carried out, and the electrical characteristics of the IGBT module 1 can be measured.

Figure 7:
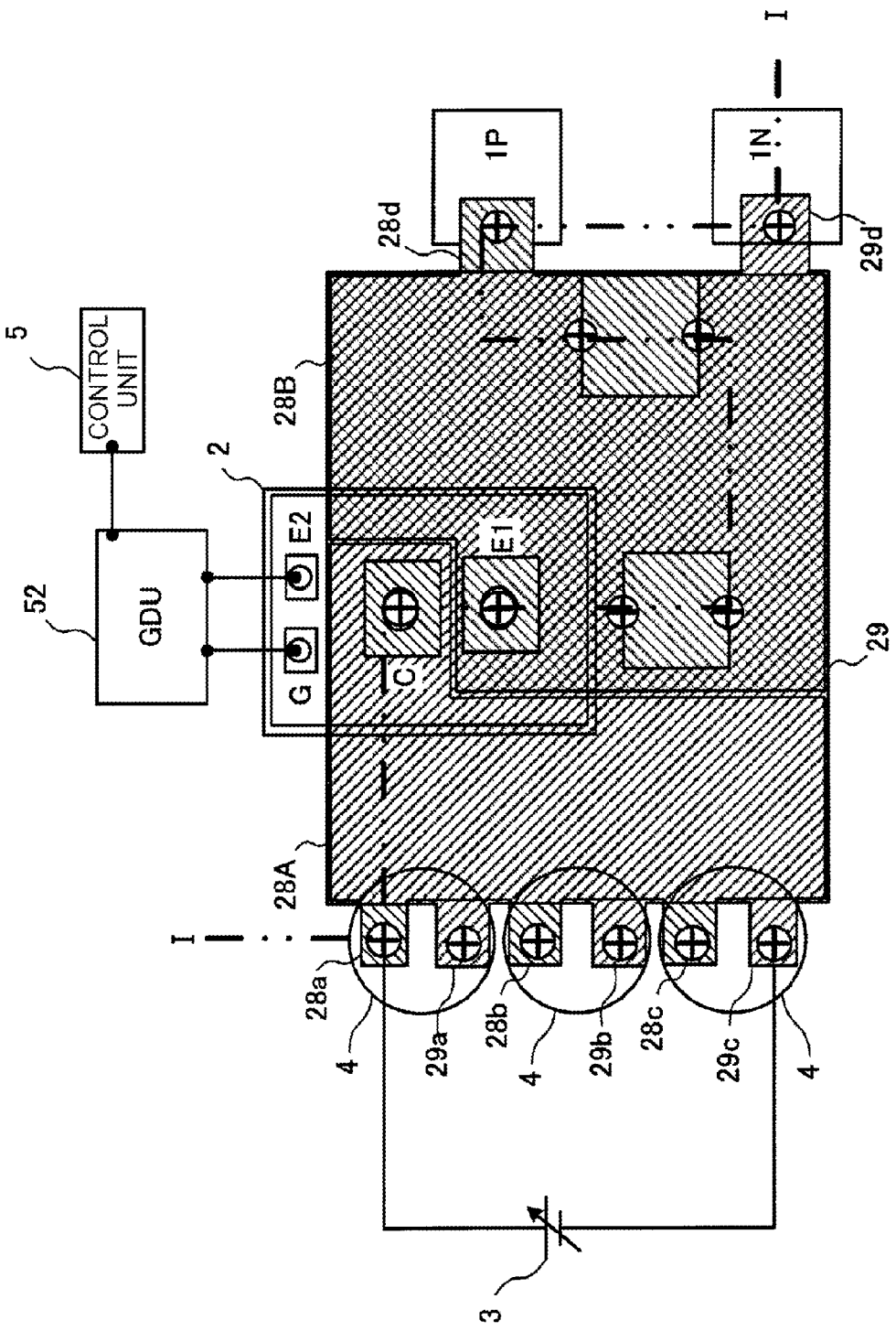
FIG. 7 is a plan view showing an AC test circuit unit formed of parallel plate wiring.
Figure 8:
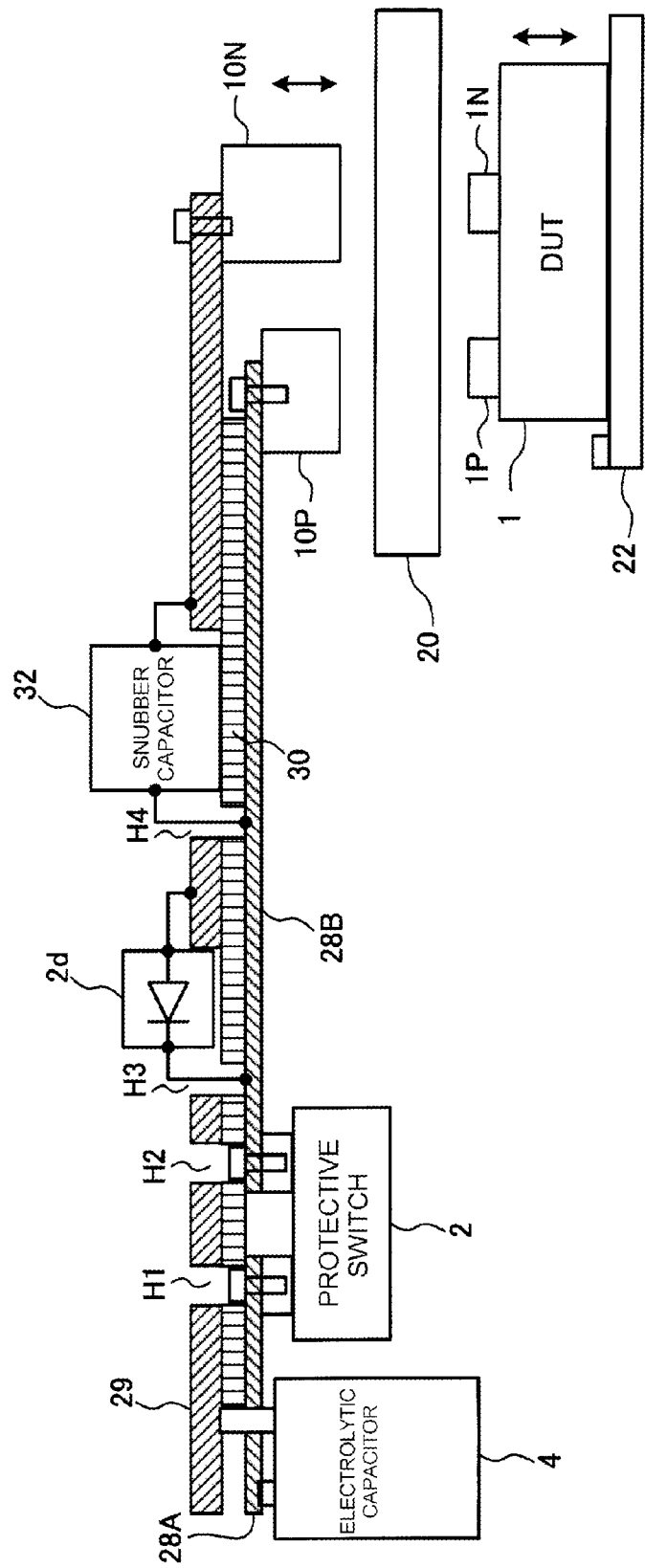
FIG. 8 is a side sectional view showing a contact structure along an I-I cross section of FIG. 7.

FIG. 7 is a plan view showing the AC test circuit unit formed of the parallel plate wiring. FIG. 8 is a side sectional view showing the circuit wiring structure along an I-I cross section of FIG. 7.

The P side parallel plate 28 is configured of two electrode plates 28A and 28B forming L-shapes disposed in the same plane separated by a slight interval from each other, and the N side parallel plate 29 is disposed on the upper surface of the electrode plates 28A and 28B across the insulating sheet 30. The electrode plate 28A is such that one terminal portion 28a is connected to the positive electrode of the electrolytic capacitor 4, and the electrode plate 28A is connected to a collector terminal C of the protective switch circuit 2 at a terminal portion on the opposite side. Also, the electrode plate 28B, being electrically cut off from the electrode plate 28A, is connected to an emitter electrode E1 of the switch circuit 2 at a terminal portion close to the electrode plate 28A, and a terminal portion 28d on the opposite side is connected to the connection contact portion 1P on the P terminal side of the DUT.

The parallel plate 29, which is the N side electrode, is such that one terminal portion 29d is connected to the connection contact portion 1N on the N terminal side of the DUT, and the parallel plate 29 is connected to the negative electrode of the electrolytic capacitor 4 at a terminal portion 29a on the opposite side. Herein, by the electrode plates 28A and 28B and parallel plate 29 being disposed stacked either side of the insulating sheet 30, they are in as close a contact as possible with each other sandwiching the insulating sheet.

Herein, the N side parallel plate 29 is disposed on the upper side, but this is in order that the risk of electrocution can be reduced. However, considered only in terms of functionality, there is no problem in the P side electrode plates 28A and 28B being disposed on the upper side either.

The characteristic of the measurement circuit is the point that, when connecting from the electrolytic capacitor 4 to the P and N terminals of the DUT, it is possible to secure a large area for the P and N side electrode plates 28A and 28B and parallel plate 29 disposed in parallel. Currents flow in opposite directions in the P and N side electrode plates 28A and 28B and parallel plate 29 and, as magnetic fields are cancelled out in regions disposed parallel to each other, it is possible to reduce the circuit inductance there.

In the AC test circuit shown in FIG. 7, the only wires not disposed in parallel are the terminal portions 28d and 29d for connecting to the DUT P and N terminal contact members, and the length of these wires is in the region of a mere 20 mm. Consequently, it is possible to keep the overall length of the wire portions not disposed in parallel within 40 mm.

It is possible to install peripheral parts and accessory circuits as necessary in the AC test circuit shown in FIG. 7. As shown in FIG. 8, it is possible to connect the surge voltage protection diode 2d, snubber capacitor 32, and protective switch circuit 2 to the P side electrode plates 28A and 28B by providing holes H1 to H4 as appropriate in the N side parallel plate 29 and insulating sheet 30.

Figure 10:
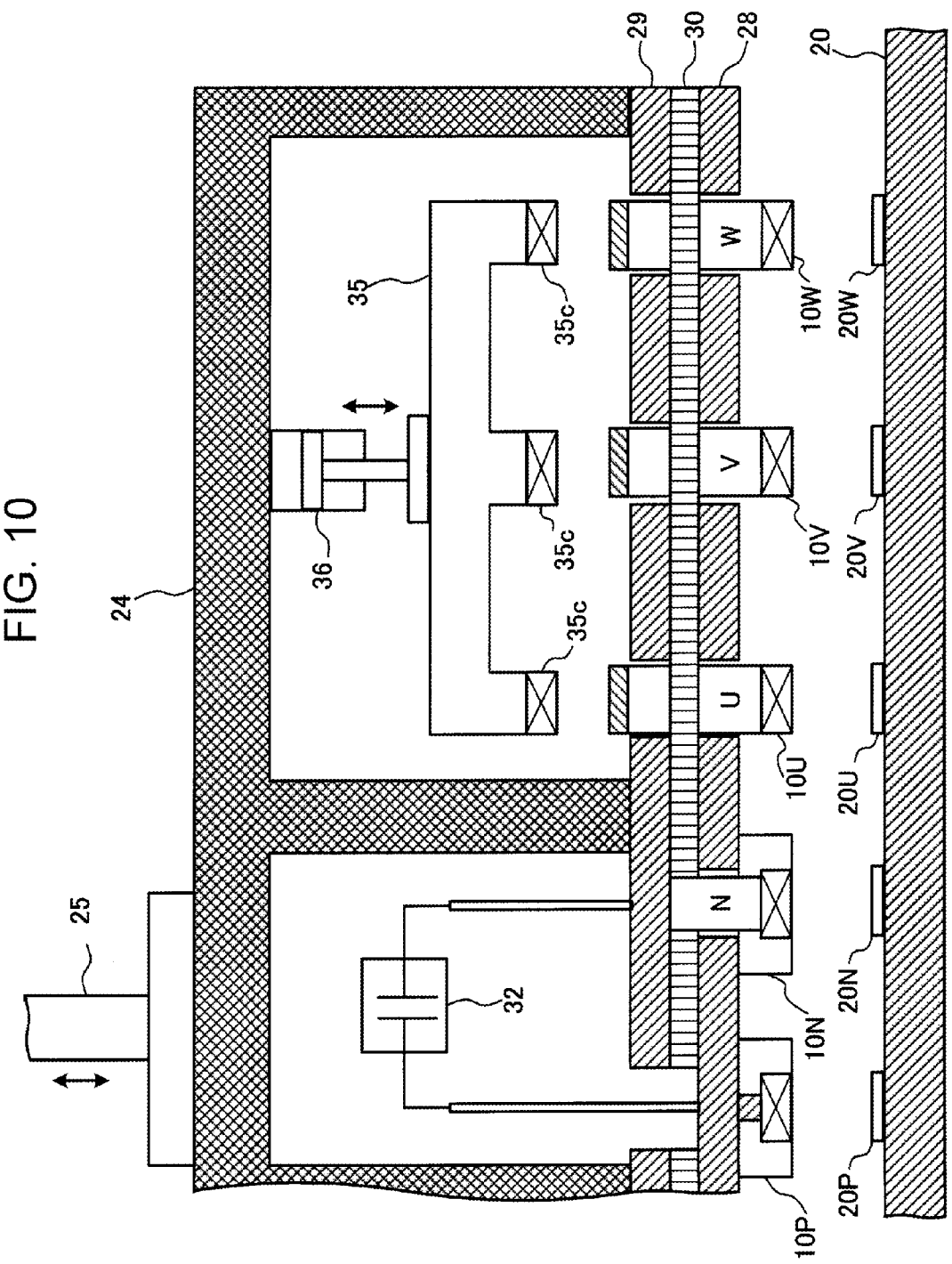
FIG. 10 is a side view showing an example of a short circuit switch of output terminals used in a load short circuit test in the test circuit of FIG. 5.
Figure 11:
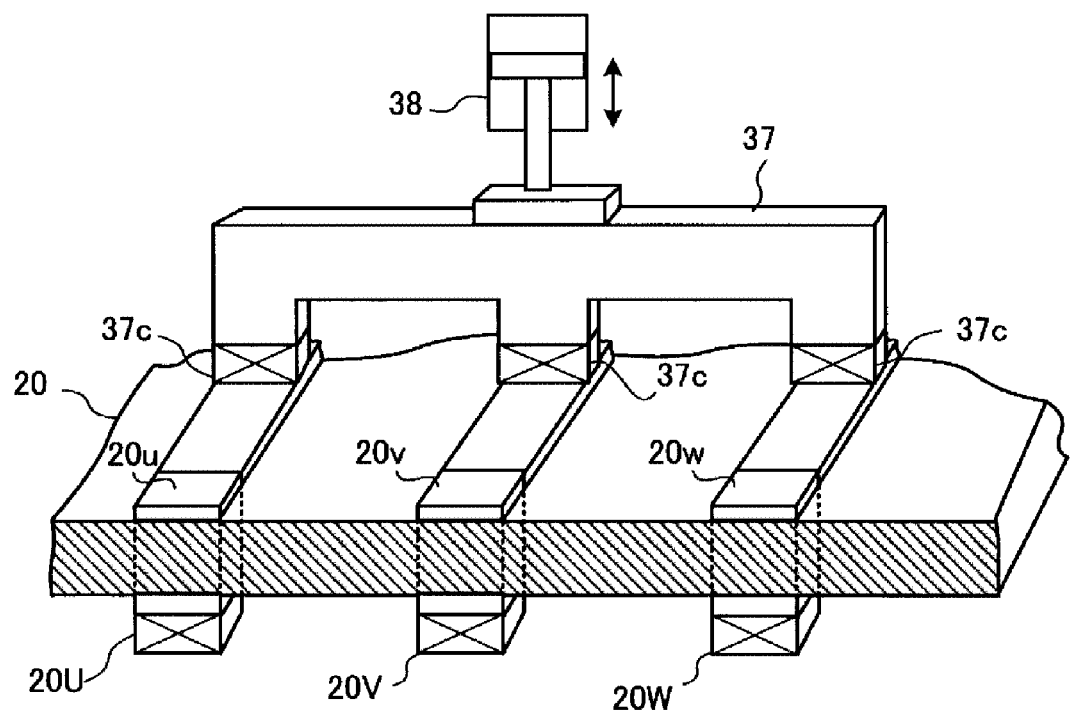
FIG. 11 is a perspective view showing an inter-output terminal shorting bar different from that of the short circuit switch of FIG. 10.

Also, when carrying out a switching test using the AC test circuit shown in FIG. 7, it is necessary to connect the load inductor 6 between the intermediate terminals (the U, V, and W terminals) of the DUT in the AC test circuit unit 24. When carrying out a load short circuit test using the test circuit shown in FIG. 1, it is necessary to cause a short circuit between the intermediate terminals (the U, V, and W terminals) using a shorting bar, or the like. In order to do this, it is sufficient, along with raising or lowering a wire contact or shorting bar directly connected to the load, to establish a connection path with the lower side electrode plates 28A and 28B by providing an extraction electrode that establishes a contact or non-contact condition with the electrode plates 28A and 28B and parallel plate 29, making a hole in a necessary portion of the upper side parallel plate 29, or the like, as shown in FIG. 10 or FIG. 11, to be described hereafter.

In this way, by switching the connection to the IGBT module 1 between the DC tester 17 and AC tester 16 in the integrated test device 10 shown in FIG. 6, a plurality of kinds of test are possible at one time.

Figure 9:
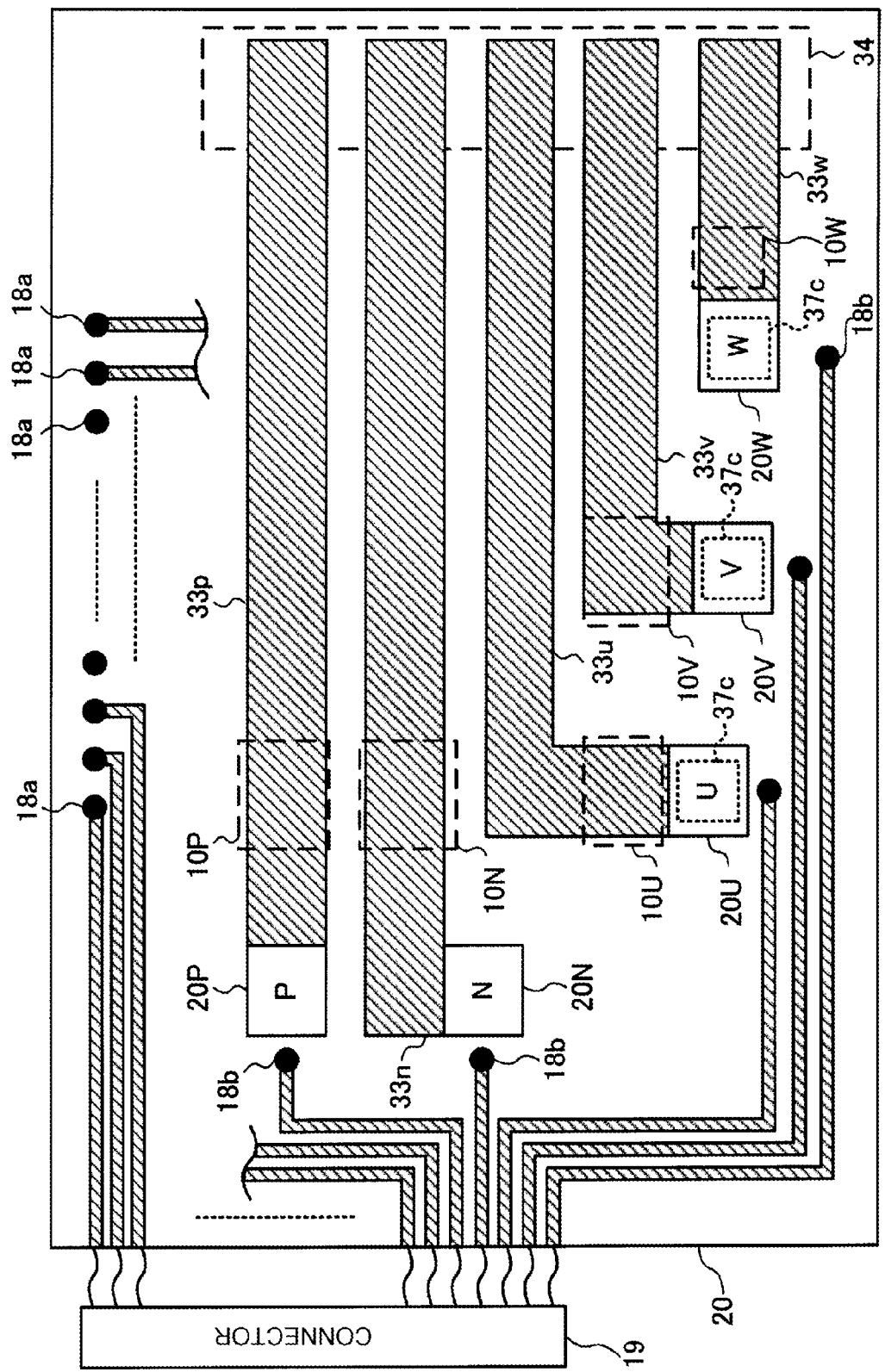
FIG. 9 is a plan view showing a detailed configuration of an intermediate electrode plate used in the DC/AC integrated tester of FIG. 6.

FIG. 9 is a plan view showing a detailed configuration of the intermediate electrode plate used in the DC/AC integrated tester of FIG. 6.

The metal blocks 20P, 20N, 20U, 20V, and 20W penetrate from the members disposed on the lower side of the intermediate electrode plate 20 that come into contact with the external terminals 1N, 1P, 1U, 1V, and 1W of the IGBT module 1 to the side that connects with the AC test circuit unit 24, forming an electrode surface on the upper surface of the intermediate electrode plate 20. Copper patterns 33$p$, 33$n$, 33$u$, 33$v$, and 33$w$ are extended as wiring portions from the electrode surface of each of the metal blocks 20P, 20N, 20U, 20V, and 20W on the intermediate electrode plate 20. End portions of the copper patterns 33$p$, 33$n$, 33$u$, 33$v$, and 33$w$ are extended to a DC tester connection contact region 34 on the upper surface of the intermediate electrode plate 20. The contact region 34 is a region with which, for example, the contact probes 26$a$ shown in FIG. 6 make contact.

The broken line regions 10P, 10N, 10U, 10V, and 10W shown on the copper patterns 33$p$, 33$n$, 33$u$, 33$v$, and 33$w$ indicate positions with which each contact surface of the AC contact device comes into contact when the AC test circuit unit 24 descends. As far as possible, these positions are disposed in positions whereby the contact members 10P, 10N, 10U, 10V, and 10W of the AC test circuit unit 24 and the terminals 1P, 1N, 1U, 1V, and 1W of the DUT can be connected close together.

Also, a plurality of vertical probes 18$a$ are disposed in positions corresponding to the control terminals of the IGBT drive IC, and a plurality of vertical probes 18$b$ in positions corresponding to the Kelvin measurement sense terminals, in such a way as to surround the copper patterns 33$p$, 33$n$, 33$u$, 33$v$, and 33$w$. With regard to the wiring from the control terminals of the drive IC incorporated in the IGBT module, when it is necessary to provide a circuit substrate in the immediate vicinity of the IGBT module 1 (refer to Fuji Electric Device Technology Co., Ltd. "Fuji IPM Application Manual" (pages 4-1 to 4-7), [online], February, 2004, [searched for on Sep. 17, 2010], internet URL: http://www.fujielectric.co.jp/products/semiconductor/technical/application/index.html), the circuit substrate may be provided on, or in the periphery of, the intermediate electrode plate 20, as heretofore described. Also, in the case of a DUT wherein the IGBT module 1 does not incorporate a drive IC, the gate drive substrate (GDU) and changeover switch for the wiring to the GDU and DC tester can also be disposed on the intermediate electrode plate 20, or in the periphery thereof.

As a characteristic of the heretofore described DC/AC integrated tester, the previously described "intermediate electrode plate" is provided between the IPM, which is the DUT, and the test circuit. By selecting a connected or non-connected condition between the DUT and each of the DC tester and AC tester via the intermediate electrode plate, it is possible to realize a DC/AC integrated tester with low inductance. Contact members for the DUT corresponding to the external terminals of the DUT are mounted on the lower side surface of the intermediate electrode plate.

It is sufficient to appropriately select contact members with a form such as a probe type, a block type, a socket type, or a leaf spring type, in accordance with the form of the DUT external terminals and energization conditions (current and voltage).

Next, a description will be given of actions of the DC/AC integrated tester shown in FIG. 6.

Firstly, as an initial condition, the DUT mounting base 22 is put into a condition in which it is separated from the intermediate electrode plate 20 by lowering the cylinder 23, and the contact portions 10P, 10N, 10U, 10V, and 10W, and DC contact probes 26$a$, are also put into a condition in which they are separated from the intermediate electrode plate 20 by raising the cylinders 25 and 27. Also, the electrolytic capacitor 4 is charged in advance with a test voltage from the AC tester 16. However, the protective switch circuit 2 is put into an off condition, and the discharge circuit switch of the snubber capacitor 32 is maintained in an on condition.

Next, an IPM is set on the DUT mounting base 22 as the DUT, a start signal is given, and the cylinder 27 is lowered simultaneously with the cylinder 23 being raised. By so doing, the contact probes 26$a$ come into contact with the DC tester connection contact region 34, and the external terminals of the IPM are connected to the DC tester 17 across the intermediate electrode plate 20.

Next, after the connection between the external terminals of the IPM and DC tester 17 is completed, a test start signal is transmitted to the DC tester 17, and a DC parametric test and thermal resistance test are carried out.

When the DC parametric test is finished, a test end signal emitted from the tester is received and, with the cylinder 23 maintained in the raised condition, the DC tester 17 is cut off from the intermediate electrode plate 20 by raising the cylinder 27. Furthermore, the cylinder 25 holding the AC test circuit unit 24 is lowered. By so doing, the AC tester 16 is connected to the IPM across the intermediate electrode plate 20.

Figure 18:
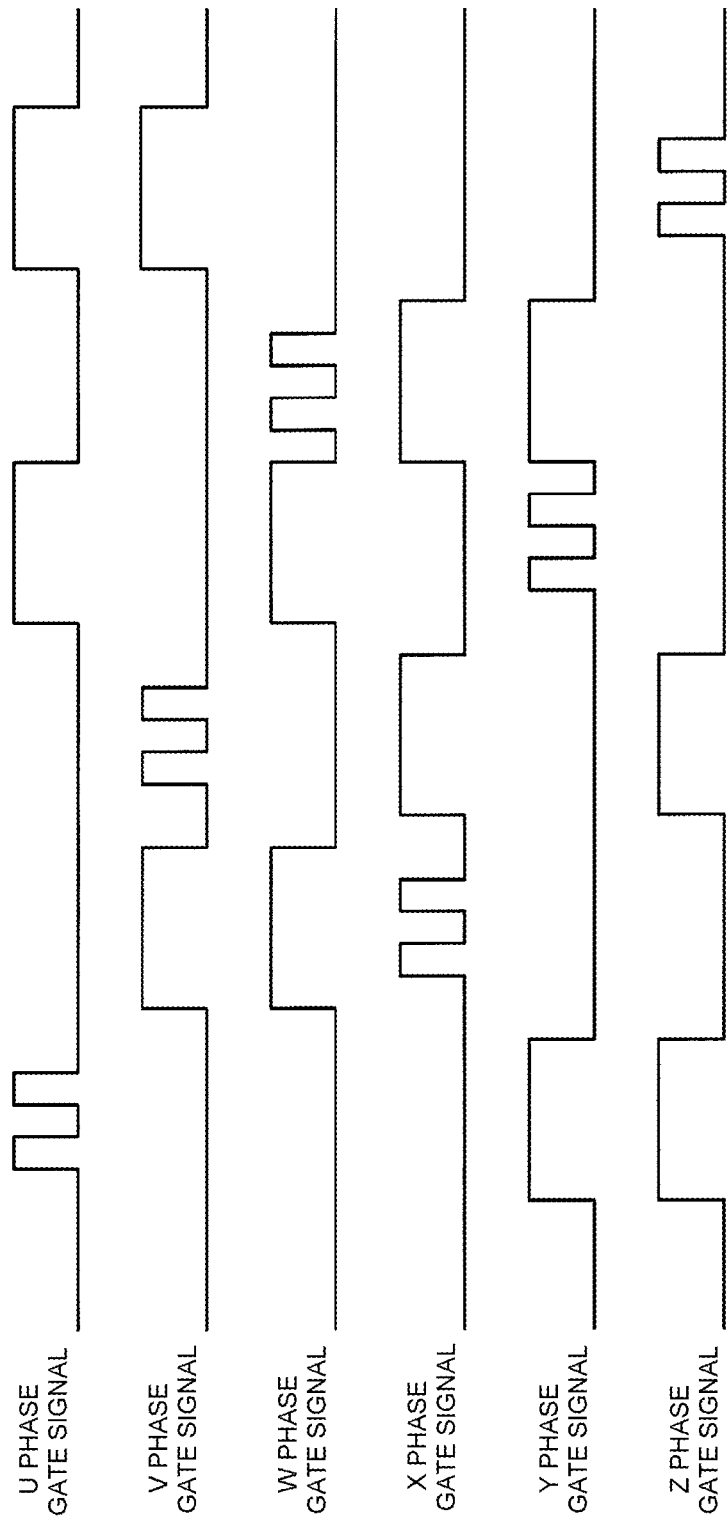
FIG. 18 is a timing chart showing an example of measurement signals supplied to the test circuit of FIG. 17.
Figure 19:
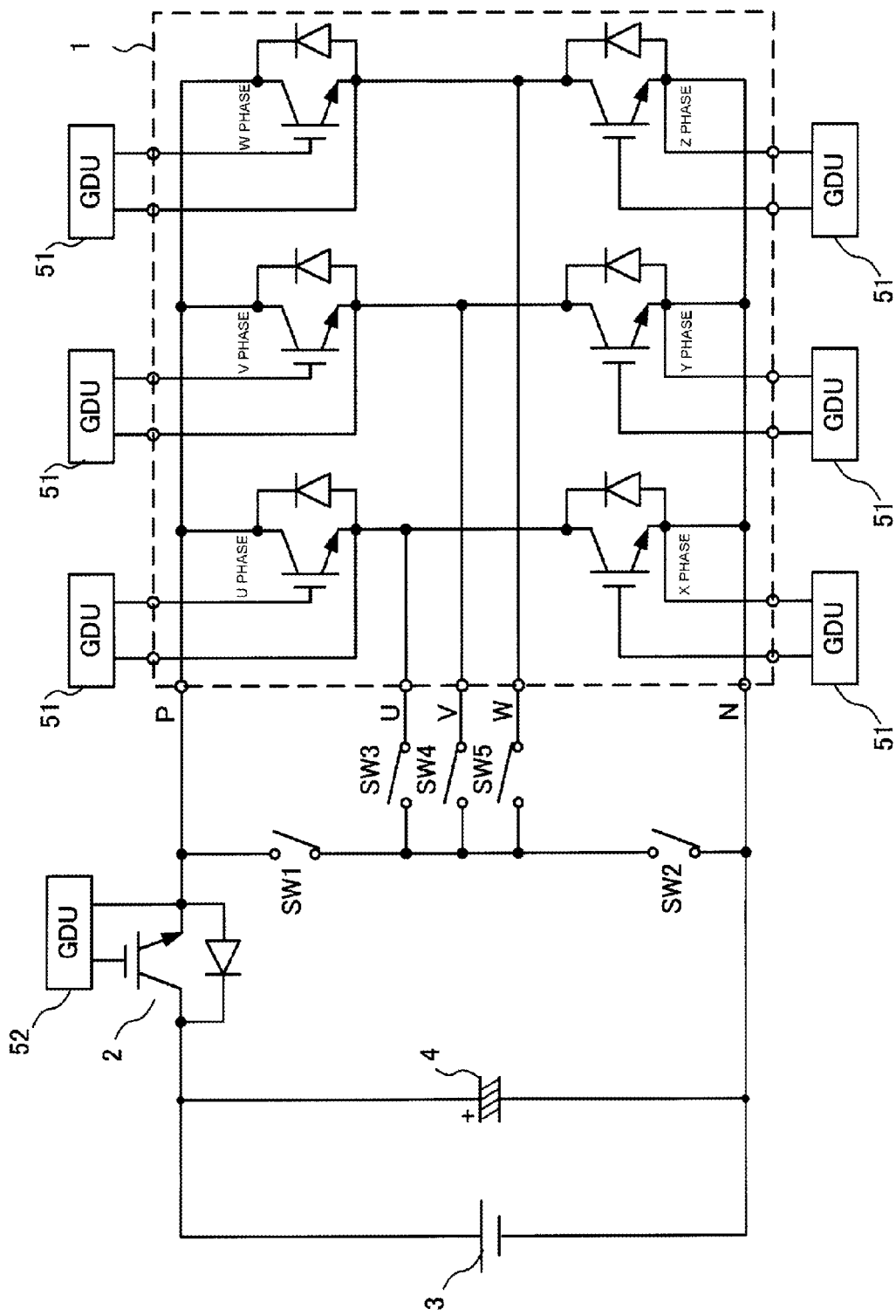
FIG. 19 is a circuit diagram showing a configuration of a heretofore known test circuit for a load short circuit test.
Figure 20:
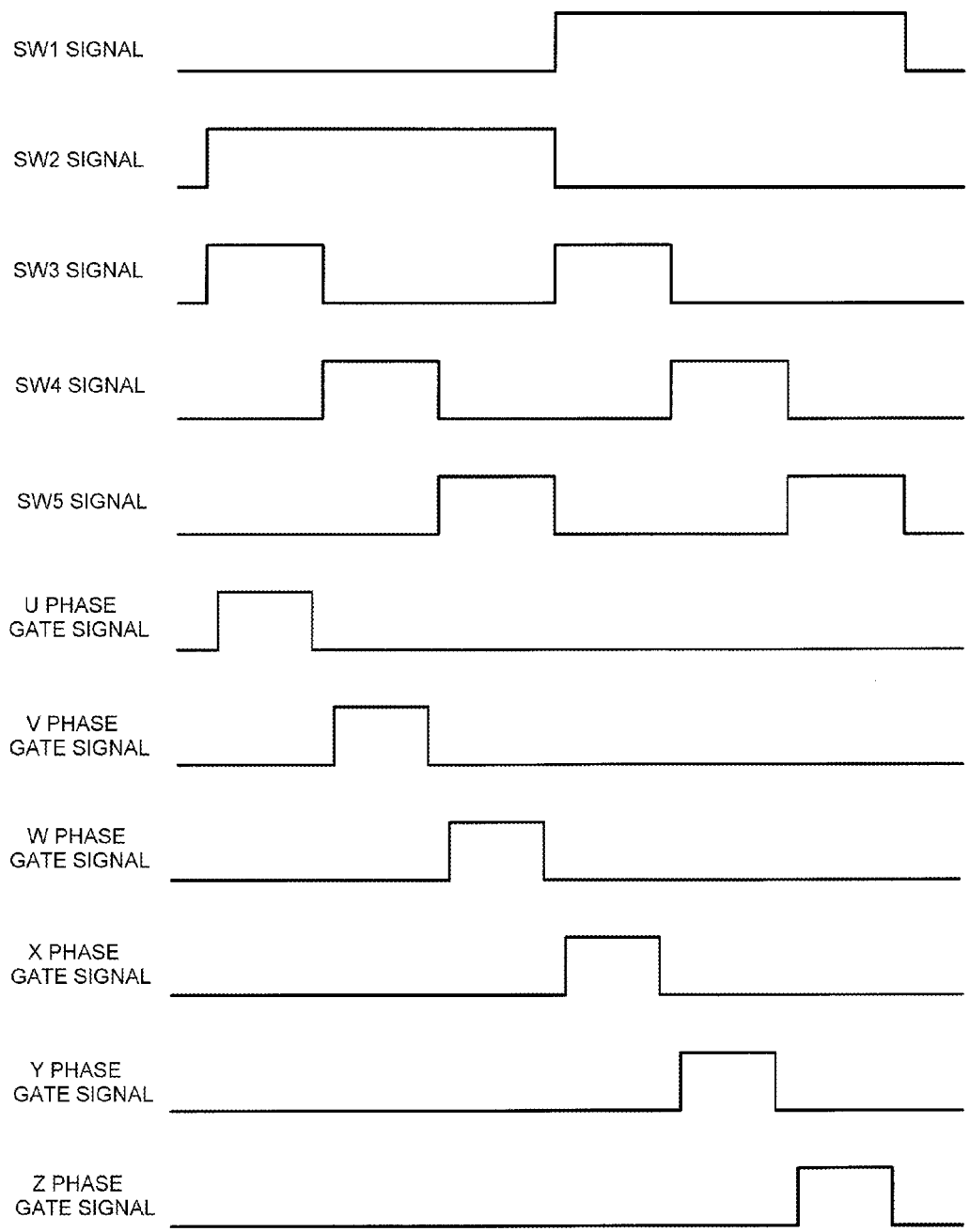
FIG. 20 is a timing chart showing an example of switch signals and phase gate signals in the test circuit of FIG. 19.

Next, the discharge circuit switch of the AC tester 16 is put into an off condition, putting the snubber capacitor 32 into a chargeable condition, and furthermore, the protective switch circuit 2 is put into an off condition. At this time, all of the short circuit switches close to the U, V, and W terminals of the AC tester 16 are put into an off condition. In this condition, the measurement signals shown in FIG. 18 are output from the AC tester 16, and a switching test is carried out.

After the switching test is finished, all of the short circuit switches close to the U, V, and W terminals are switched to an on condition, the measurement signals shown in FIGS. 2A and 2B are output from the AC tester 16, and a load short circuit test is carried out.

Next, a test end signal is received from the AC tester, the protective switch circuit 2 is put into an off condition, the discharge circuit of the capacitor 32 is put into an on condition, all test results are cross checked with individual standard values, and the IPM is evaluated as good or defective. Each of the testers 16 and 17 normally includes this evaluation function. The test results are displayed by providing a common indicator. Alternatively, when the IPM is conveyed into the integrated test device 10 using an automatic conveyor, it is also possible to eject good and defective articles separately, in accordance with the test results, by transmitting the results to the automatic conveyor with an electric signal. Finally, after the cylinder 25 is raised, the cylinder 23 is lowered, and the IPM set on the DUT mounting base 22 is removed.

In this way, with the integrated test device 10, not only is it possible to reduce the necessary number of contact devices connecting the DUT and each tester, but it is also possible to integrally operate the DC tester and AC tester operated as individual testers to date. Moreover, by reducing common parts, it is possible to reduce investment in equipment. Also, by reducing the number of times the DUT is handled, it is possible to realize a reduction in operating cost, and a simplification and reduction in price of the conveyor device.

Fourth Embodiment

FIG. 10 is a side view showing an example of a short circuit switch of the output terminals used in a load short circuit test in the test circuit of FIG. 5.

Although a relay switch is used as the inter-terminal short circuit switch in the DC/AC integrated tester of FIG. 6, a low inductance characteristic is required of the short circuit switch, as previously described. For this reason, with the short circuit switch shown in FIG. 10, each electrode of the IPM is short circuited via the metal blocks 20U, 20V, and 20W of the intermediate electrode plate 20 by raising and lowering a shorting bar 35 with a cylinder 36 from above the contact portions 10U, 10V, and 10W provided in the parallel plate 29.

Fifth Embodiment

FIG. 11 is a perspective view showing an inter-output terminal shorting bar different from that of the short circuit switch of FIG. 10.

When an inductance characteristic lower still than that of FIG. 10 is required, it is also possible for a direct short circuit connection to be made between the electrodes 20U, 20V, and 20W of the intermediate electrode plate 20 with the kind of shorting bar 37 shown in FIG. 11. Positions in which each contact surface 37c of the shorting bar 37 comes into contact are indicated by broken lines on the intermediate electrode plate 20 shown in FIG. 9. In this case, a cylinder 38 for raising and lowering the shorting bar 37 is fixed to the top plate 10T of the integrated test device 10, in the same way as the cylinders 25 and 27 shown in FIG. 6. When there is a restriction on the electrode pattern of the intermediate electrode plate 20, or when it is difficult to bring the shorting bar into contact with 37c of FIG. 6, the shorting bar may be brought into contact with any position on the copper wire patterns 33u, 33v, and 33w, in a position as near as possible to the contact surfaces 37c.

Figure 12A:
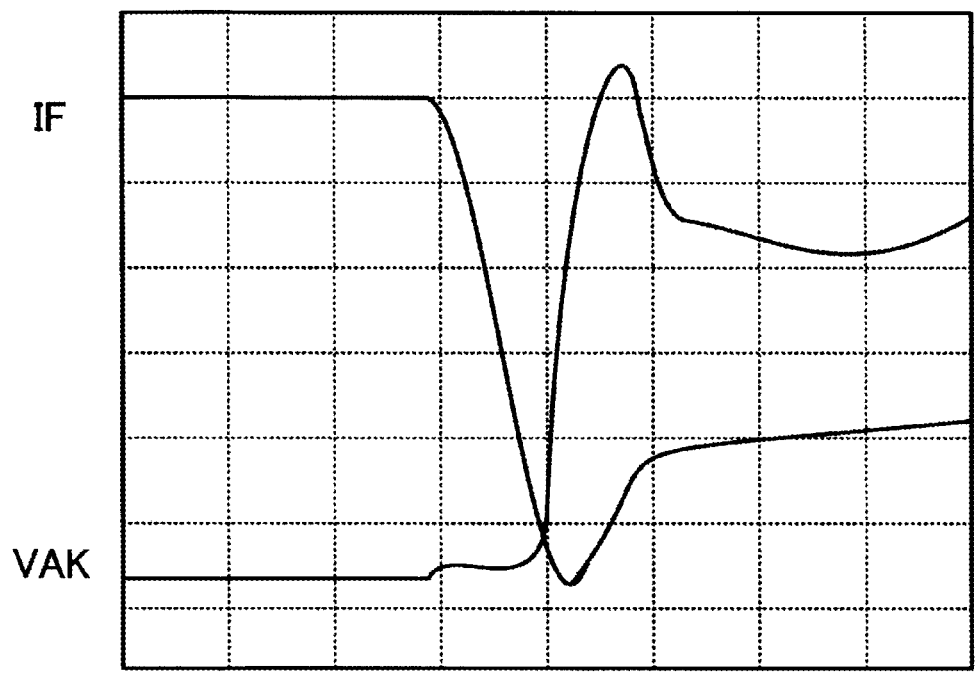
FIGS. 12A and 12B are diagrams showing a comparison of current and voltage waveforms in a reverse recovery test between the parallel plate circuit (FIG. 7) and when a copper bar is connected as in FIG. 22.
Figure 12B:
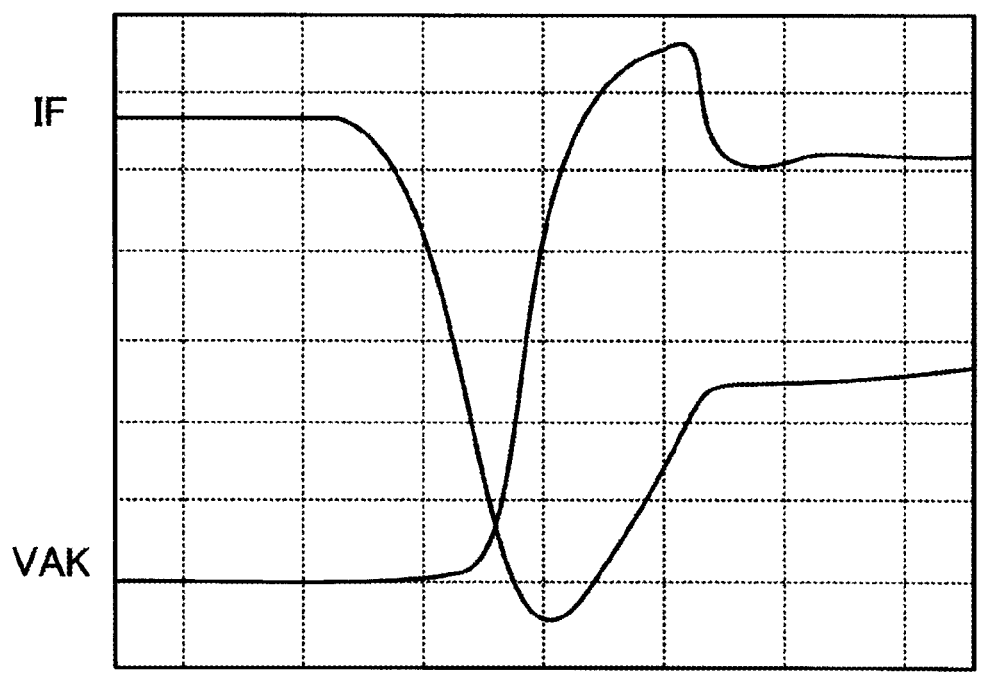

FIGS. 12A and 12B are diagrams showing a comparison of current and voltage waveforms in a reverse recovery test between the parallel plate circuit (FIG. 7) and when a copper bar is connected as in FIG. 22.

When the ratings of the IGBT used as the DUT are 450 A and 1,700V, in an FWD reverse recovery test using a chopper circuit, di/dt=2,700 A/µs with a heretofore known tester configured of a copper bar (the circuit of FIG. 22). As opposed to this, di/dt with the parallel plate type of FIG. 7 is approximately four times larger at 11,000 A/µs, and it is possible to apply sufficient stress.

Figure 13A:
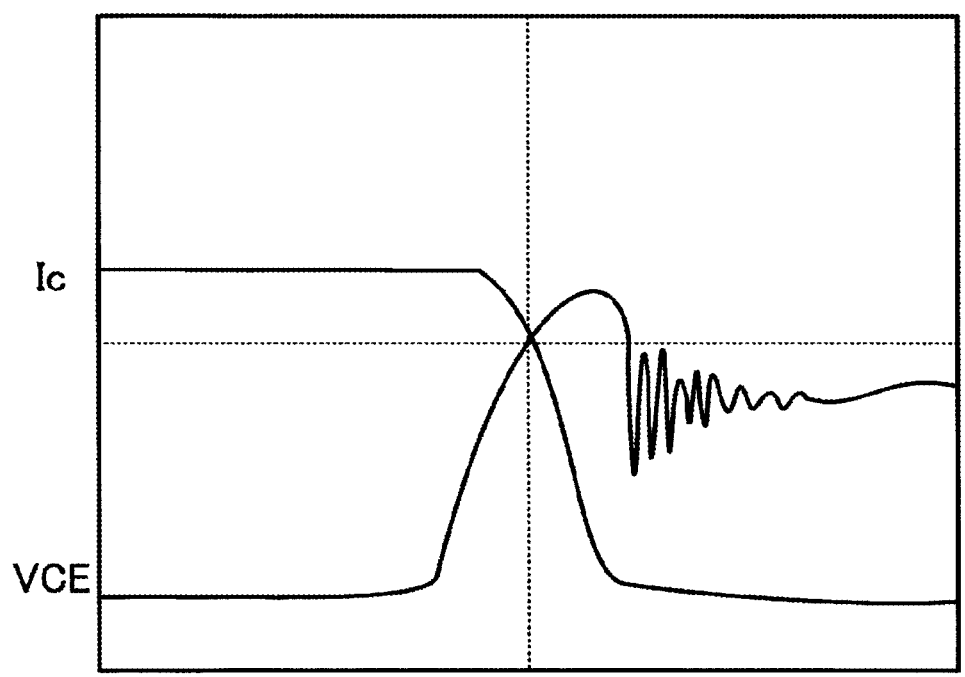
FIGS. 13A and 13B are diagrams showing a comparison of current and voltage waveforms in a turn off test between the parallel plate circuit (FIG. 7) and when a copper bar is connected as in FIG. 22.
Figure 13B:
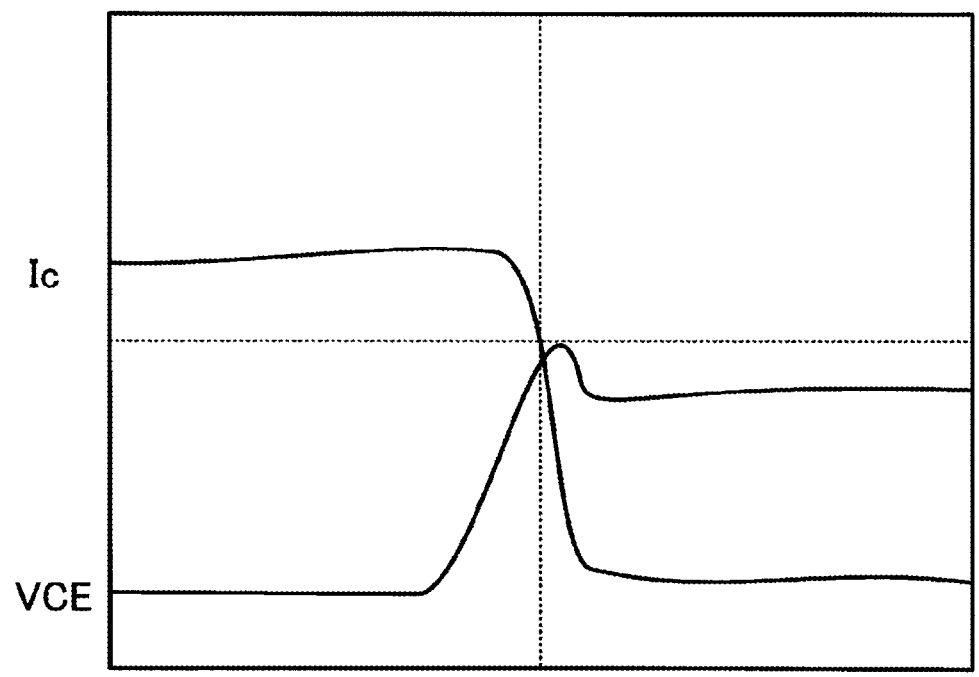

FIGS. 13A and 13B are diagrams showing a comparison of current and voltage waveforms in a turn off test between the parallel plate circuit (FIG. 7) and when a copper bar is connected as in FIG. 22.

In the same way, in an IGBT turn off test using a chopper circuit too, a surge voltage of as high as 1,775V, which is greater than the rated voltage of the DUT, is generated in a heretofore known circuit, but when using the parallel plate type, it is possible to suppress the surge voltage to 1,605V, which is lower than the rated voltage. That is, as well as preventing the application of an excessive stress, it is possible to measure switching time (fall time).

In this way, by applying a parallel plate circuit to a power semiconductor AC test device, it is possible to reduce the circuit inductance to approximately one quarter at 30 to 100 nH.

Sixth Embodiment

Next, a description will be given of an application using a parallel plate wiring in a test device of a 1-in-1 type IGBT module.

Figure 14:
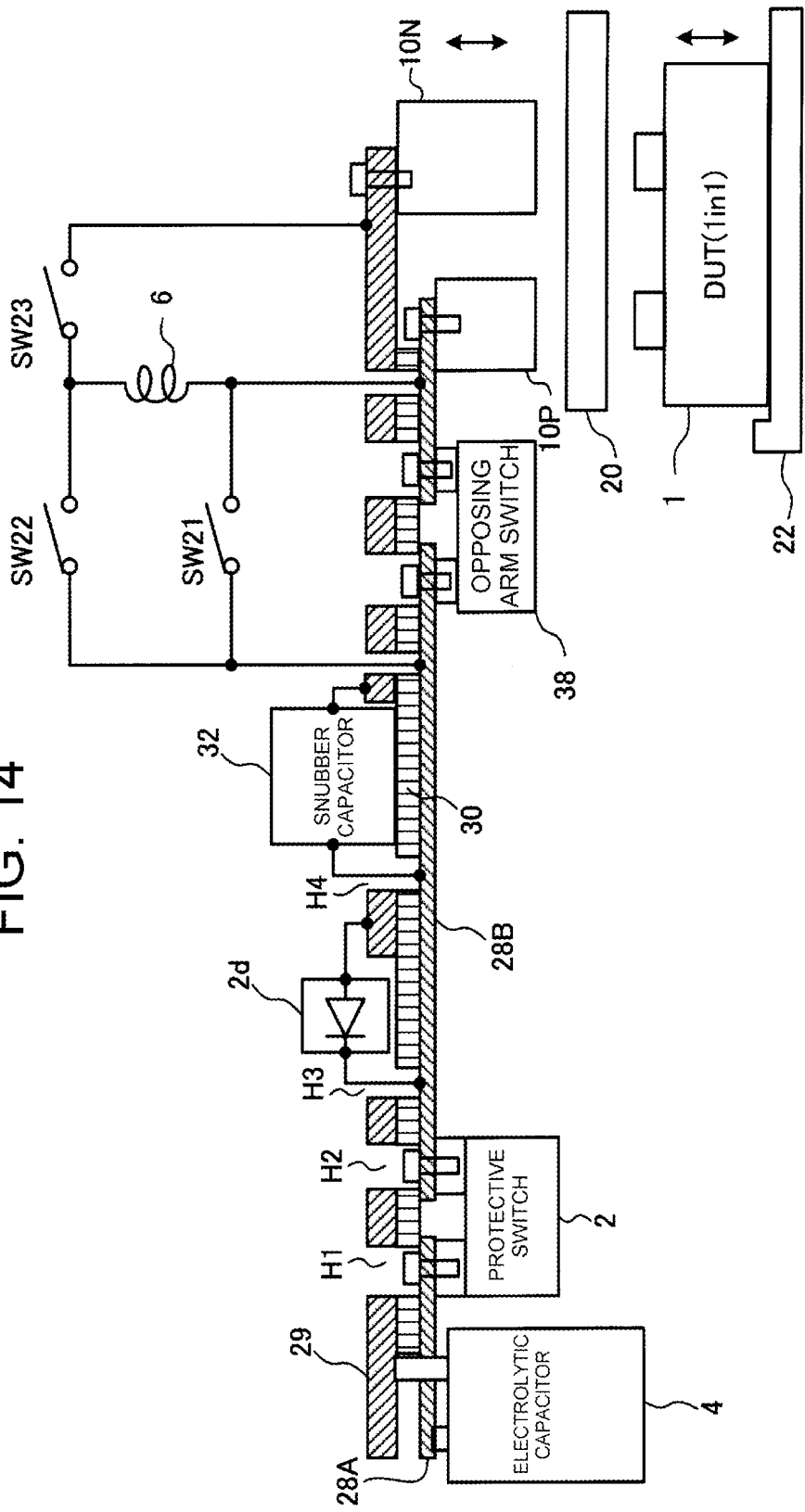
FIG. 14 is aside sectional view showing a configuration of an AC test circuit using a parallel plate wiring.

FIG. 14 is a side sectional view showing a configuration of an AC test circuit using a parallel plate wiring.

The test circuit differs from the AC test circuit unit illustrated in FIG. 8 in the following point. That is, the electrode plate 28B configuring the positive side electrode plate is cut between the portions 10P and 10N that make contact with the intermediate electrode plate 20 and the protective switch (IGBT) 2, and an opposing arm switch (a 1-in-1 type IGBT) 38 that acts as an arm opposing the DUT is disposed here. The collector electrode of the opposing arm switch 38 is connected to the power source side of the parallel plate 28B, and the emitter electrode is connected to the contact portion 10P side, as a result of which, the opposing arm switch 38 is connected in series with the protective switch 2 on the parallel plate 28B.

Also, a switch SW21 is provided between the emitter electrode and collector electrode of the opposing arm switch 38, and switches SW22 and SW23 for switching between a connection and non-connection of the load inductor 6 are provided between the parallel plate 28B connected to the portion 10P that comes into contact with the P electrode and the parallel plate 29 connected to the portion 10N that comes into contact with the N electrode. By turning on and off with the switches SW21 to SW23, a switching test with the AC tester can be realized with a chopper circuit configured of the opposing arm switch 38, the DUT 1, and the load inductor 6 (for details, refer to Fuji Electric Systems Co., Ltd. "Fuji IGBT Module Application Manual" (pages 2-5 to 2-6), [online], February, 2010, [searched for on Sep. 17, 2010], internet URL:http://www.fujielectric.co.jp/products/semiconductor/technical/application/index.html).

Of the switches SW21 to SW23 configuring the load circuit, the switch SW21 is configured of the shorting bar 35 or 37 shown in FIG. 10 or FIG. 11. Also, although the intermediate electrode plate 20 is necessary when using as the DC/AC integrated test device 10, in the case of an AC dedicated tester, it is possible to implement a test by connecting the AC test circuit unit using the parallel plate wiring directly to the external terminals 1N and 1P of the DUT 1.

Figure 15:
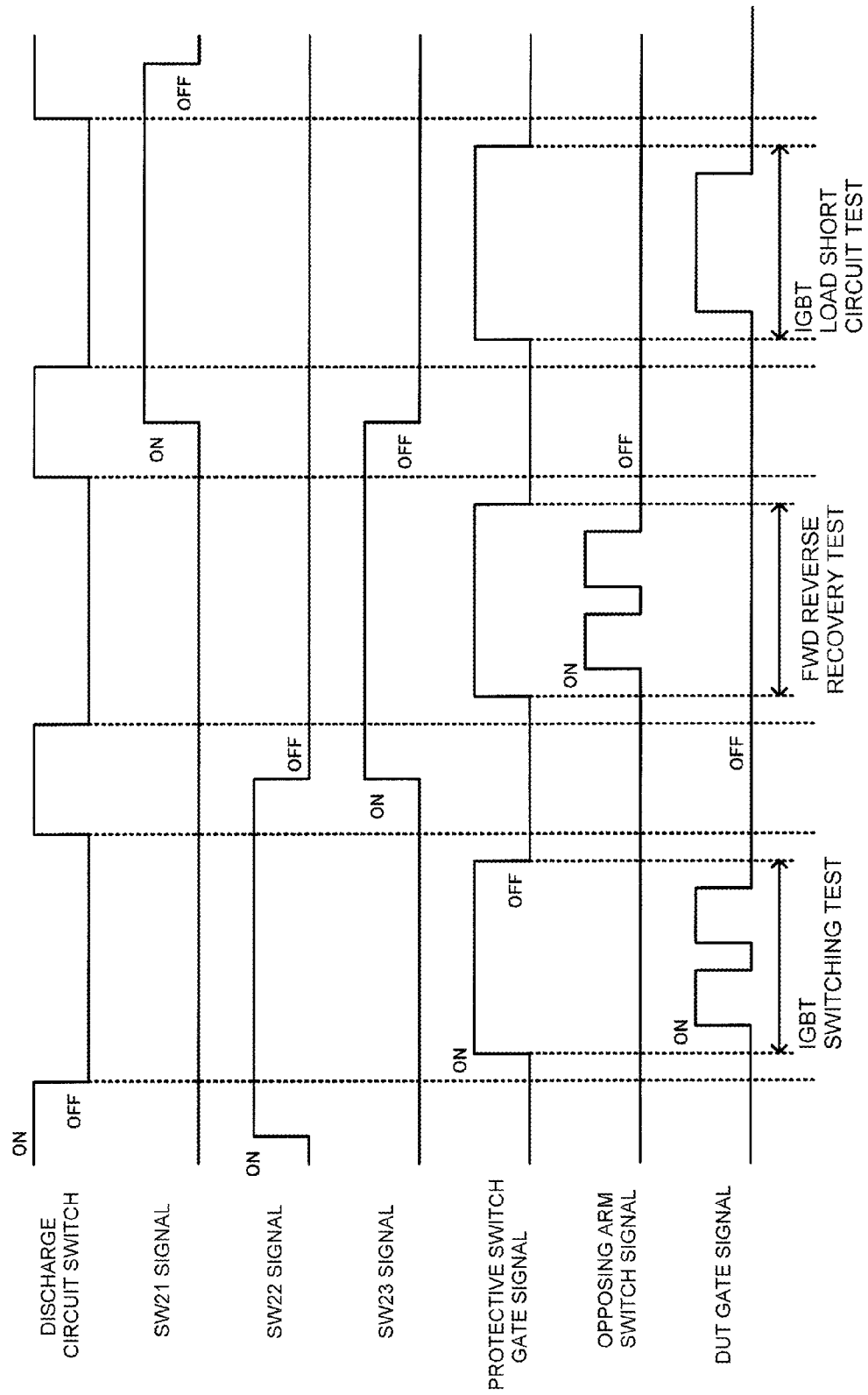
FIG. 15 is a timing chart showing an example of switch signals and phase gate signals in the test circuit of FIG. 14.

FIG. 15 is a timing chart showing an example of switch signals and phase gate signals in the test circuit of FIG. 14.

A switching test is carried out by firstly, after putting the switch SW22 in an on condition, putting the discharge circuit switch in an off condition and turning on the gate signal of the protective switch 2, then turning the gate signal to the DUT 1 on and off. Next, an FWD reverse recovery test is carried out by, after putting the switch SW23 in an on condition, putting the discharge circuit switch in an off condition and, with the gate signal of the protective switch 2 in a turned on condition, turning the gate signal of the opposing arm switch 38 on and off.

Next, a load short circuit test is carried out by putting the switch SW21 in an on condition in advance, short circuiting the two ends of the opposing arm switch 38, then, after putting the protective switch 2 in an on condition, applying a specified on signal to the gate of the DUT 1.

Heretofore, a description has been given of embodiments wherein 6-in-1 and 1-in-1 types of IGBT module are used as the DUT 1. However, the invention can also easily be applied to a 2-in-1 or 7-in-1 type IGBT module, and furthermore, to a power integrated module (PIM) incorporating a 6-in-1 diode module and 7-in-1 IGBT that carries out an AC/DC conversion.

Figure 16:
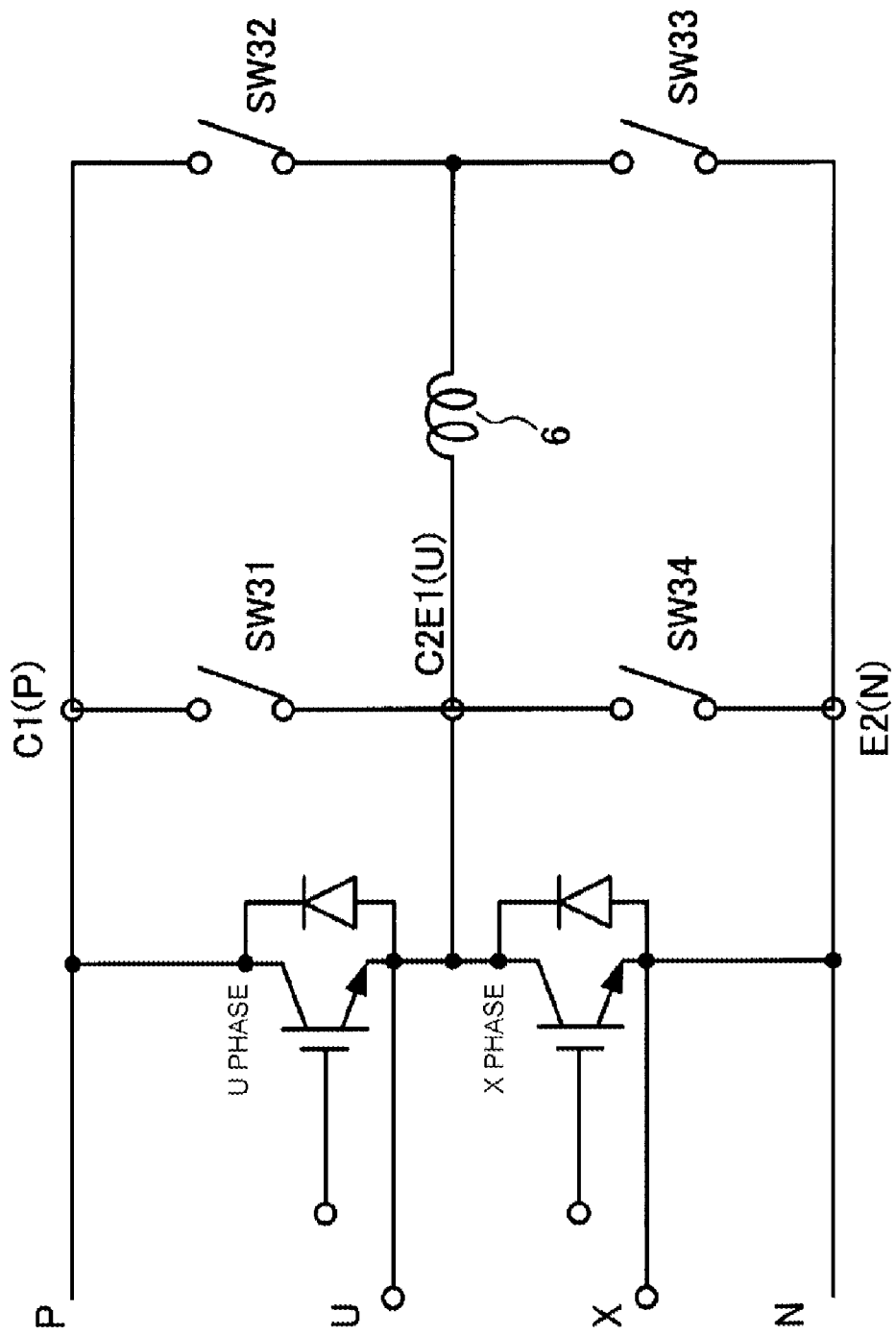
FIG. 16 is a circuit diagram showing a configuration of a test circuit when applying the test circuit of FIG. 14 to a 2-in-1 type IGBT module test.
Figure 17:
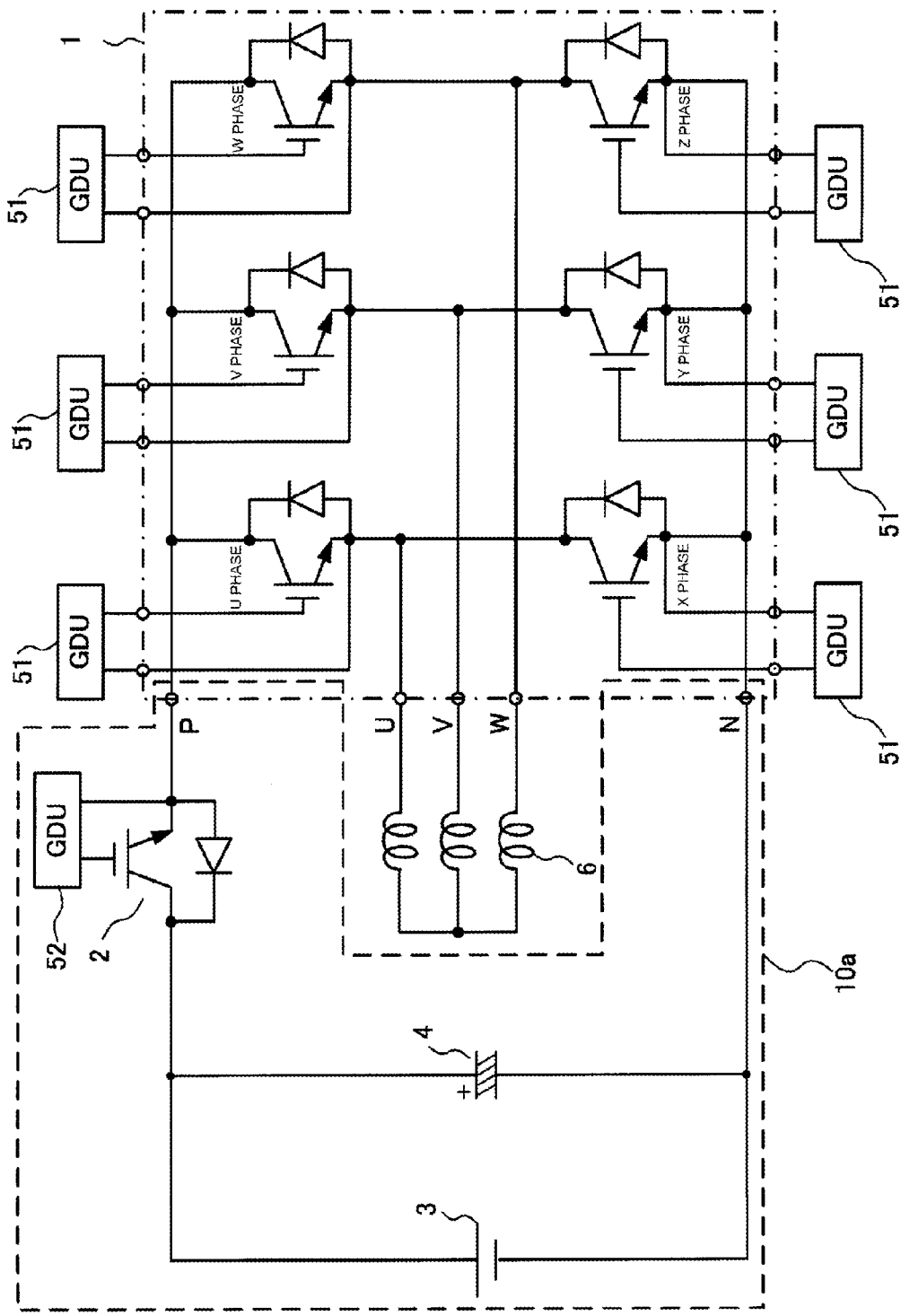
FIG. 17 is a circuit diagram showing a configuration of a heretofore known test circuit for a switching test.

FIG. 16 is a circuit diagram showing a configuration of a test circuit when applying the test circuit of FIG. 14 to a 2-in-1 type IGBT module test.

The test circuit of the drawing is configured of switches SW31 to SW34 and the load inductor 6. The switches SW31 to SW33 correspond to the switches SW21 to SW23 in the test device of the 1-in-1 type IGBT module shown in FIG. 14. That is, only the switch SW34 is newly added. Also, the switches SW31 and SW34 are configured of the shorting bar 35 or 37 shown in FIG. 10 or FIG. 11. The connection position of the load inductor 6 can be selected by putting the switches SW32 and SW33 in an on or off condition. The shorting bars 35 and 37 and switch circuit may be switched on the intermediate electrode plate 20, or may be brought into contact on the parallel plates 28 and 29.

Also, when configuring a 6-in-1 type IGBT module with three 2-in-1 type IGBT modules, testing may be carried out using the device of FIG. 6, without recourse to the test circuit of FIG. 16.

Also, testing of a 7-in-1 type or PIM can also be implemented by applying the heretofore described method. With regard to a 7-in-1 type or direct brake FWD and IGBT incorporated in a PIM, the shorting bar and load inductor circuit are disposed at either end of the FWD, and testing is carried out with a test circuit conforming to FIG. 16, in the same way as in the case of the 2-in-1 type. Also, only a DC test is carried out for a diode module and thermistor portion incorporated in a PIM. In the same way, testing of a 7-in-1 type or 6-in-1 IGBT incorporated in a PIM can be implemented by a method using the test device of FIG. 6.

What is claimed is:

1. A semiconductor test device for sequentially carrying out tests including an AC test, DC test, and thermal resistance test on a power semiconductor device, the semiconductor test device comprising:
   a holding unit that positions the power semiconductor device in a predetermined position;
   a plurality of test units that each generate a test signal for the power semiconductor device and determine a test result from a signal generated by the power semiconductor device in response to the test signal; and
   a connection unit that switches between the test units by moving the test units in opposite directions to each other to selectively connect the test units electrically to predetermined electrodes of the power semiconductor device, the connection unit being controlled such that the test units are sequentially connected to the power semiconductor device to perform a plurality of the tests.

2. The semiconductor test device according to claim 1, wherein the power semiconductor device is a power insulated gate bipolar transistor.

3. A semiconductor test device for sequentially carrying out tests including an AC test, DC test, and thermal resistance test on a power semiconductor device, the semiconductor test device comprising:
   a holding unit that positions the power semiconductor device in a predetermined position;
   a plurality of test units that each generate a test signal for the power semiconductor device and determine a test result from a signal generated by the power semiconductor device in response to the test signal; and
   a connection unit that switches between the test units and selectively connects the test units electrically to predetermined electrodes of the power semiconductor device, the connection unit being controlled such that the test units are sequentially connected to the power semiconductor device to perform a plurality of the tests, the connection unit including an intermediate electrode plate that includes on one side thereof electrodes corresponding to external terminals of the power semiconductor device, and includes on an opposite side thereof connection terminals for connecting to the test units, wherein the connection terminals are configured to be selectively electrically connected to and disconnected from one of the test units.

4. The semiconductor test device according to claim 3, wherein
   electrical connections between the test units and the predetermined electrodes are established by raising the holding unit from a lower surface side thereof with respect to the intermediate electrode plate, and
   the test units each include a contact portion and are sequentially connected to the power semiconductor device by selectively raising and lowering each contact portion with respect to the intermediate electrode plate.

5. The semiconductor test device according to claim 3, further comprising a changeover switch between the intermediate electrode plate and the test units, wherein the test units are sequentially connected to the power semiconductor device by opening and closing the changeover switch.

6. The semiconductor test device according to claim 3, further comprising:
   a direct current power source; and
   a contact unit that selectively causes a short circuit between a plurality of output terminals of the power semiconductor device,
   wherein the intermediate electrode plate includes gate drive circuits equal in number to a number of switching elements included in the power semiconductor device, said number of switching elements including a first plurality of switching elements and a second plurality of switching elements, the second plurality of switching elements including a test switching element of a phase under test,
   the power semiconductor device being configured so that when the contact unit does not cause the short circuit, the first plurality of switching elements and the second plurality of switching elements are connected to the output terminals, and
   wherein when the direct current power source has a specified voltage value and the output terminals are short circuited by the contact unit, the first plurality of switching elements and the test switching element are each put into an on condition for a specified time, and a load short circuit test is carried out.

7. A semiconductor test device for sequentially carrying out tests including an AC test, DC test, and thermal resistance test on a power semiconductor device, the semiconductor test device comprising:
   a holding unit that positions the power semiconductor device in a predetermined position;
   a plurality of test units that each generate a test signal for the power semiconductor device and determine a test result from a signal generated by the power semiconductor device in response to the test signal; and a connection unit that switches between the test units and selectively connects the test units electrically to predetermined electrodes of the power semiconductor device, the connection unit being controlled such that the test units are sequentially connected to the power semiconductor device to perform a plurality of the tests, connection unit including a parallel plate circuit that connects one of the test units, that is an AC tester, to one of the predetermined electrodes of the power semiconductor device.

8. A semiconductor test device comprising:

a semiconductor test circuit that generates a test signal to perform an AC test on a power semiconductor device, the semiconductor test circuit having positive and negative power sources; and a connection device including parallel plate electrodes disposed in parallel, and proximate to each other with an insulating sheet disposed therebetween, the parallel plate electrodes and the insulating sheet being movable between a first position to electrically connect the power semiconductor device to the positive and negative power sources and transmit the test signal to the power semiconductor device, and a second position to electrically disconnect the power semiconductor device from the positive and negative power sources and prevent transmission of the test signal to the power semiconductor device.

* * * * *